United States Patent
Liu et al.

(10) Patent No.: US 12,471,403 B2
(45) Date of Patent: Nov. 11, 2025

(54) SOLAR CELL, METHOD FOR MANUFACTURING THE SAME, PHOTOVOLTAIC MODULE, AND PHOTOVOLTAIC SYSTEM

(71) Applicant: TRINA SOLAR CO., LTD., Changzhou (CN)

(72) Inventors: Chengfa Liu, Changzhou (CN); Hong Chen, Changzhou (CN); Daming Chen, Changzhou (CN); Yifeng Chen, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/654,091

(22) Filed: May 3, 2024

(65) Prior Publication Data

US 2024/0387768 A1 Nov. 21, 2024

Related U.S. Application Data

(63) Continuation of application No. 18/386,531, filed on Nov. 2, 2023, now Pat. No. 12,125,937.

(30) Foreign Application Priority Data

May 16, 2023 (CN) .......................... 202310548868.4

(51) Int. Cl.
*H10F 77/20* (2025.01)
*H10F 71/00* (2025.01)
(Continued)

(52) U.S. Cl.
CPC ........... *H10F 71/129* (2025.01); *H10F 71/00* (2025.01); *H10F 71/121* (2025.01);
(Continued)

(58) Field of Classification Search
CPC ...... H10F 71/129; H10F 77/14; H10F 77/147; H10F 77/311; H10F 77/70; H10F 77/703; H10F 77/707
See application file for complete search history.

(56) References Cited

U.S. PATENT DOCUMENTS

| | | | |
|---|---|---|---|
| 4,886,555 A | 12/1989 | Hackstein | |
| 5,935,344 A | 8/1999 | Endo et al. | |

(Continued)

FOREIGN PATENT DOCUMENTS

| | | | |
|---|---|---|---|
| CN | 109037359 A | 12/2018 | |
| CN | 110400854 A | 11/2019 | |

(Continued)

OTHER PUBLICATIONS

Japanese Patent Office, Notification of Reasons for Refusal issued in corresponding Application No. 2023-180920, dated Nov. 5, 2024, 3 pp.

(Continued)

*Primary Examiner* — Christina Chern
(74) *Attorney, Agent, or Firm* — Taft Stettinius & Hollister LLP

(57) ABSTRACT

The present application relates to a solar cell and a method for manufacturing same, a photovoltaic module, and a photovoltaic system. The solar cell includes a substrate, a doped conducting layer, a first passivation layer, a passivating contact layer, and a second passivation layer. At least a first surface and a portion of a first side surface of the substrate include a textured structure. The doped conducting layer is disposed at least on the first surface and the first side surface to cover the textured structure. The first passivation layer is stacked on the doped conducting layer and covers the first surface and the first side surface to cover the doped conducting layer. The passivating contact layer is disposed on a second surface of the substrate. The second passivation (Continued)

layer is stacked on the passivating contact layer and covers the second surface to cover the passivating contact layer.

20 Claims, 17 Drawing Sheets

(51) Int. Cl.
  *H10F 77/30* (2025.01)
  *H10F 77/70* (2025.01)
(52) U.S. Cl.
  CPC ......... *H10F 77/211* (2025.01); *H10F 77/703* (2025.01); *H10F 77/311* (2025.01)

(56) References Cited

U.S. PATENT DOCUMENTS

| | | |
|---|---|---|
| 11,081,617 B2 | 8/2021 | Ito |
| 11,621,359 B1 | 4/2023 | Jin |
| 2004/0259335 A1 | 12/2004 | Narayanan et al. |
| 2011/0100459 A1 | 5/2011 | Yoon |
| 2011/0253211 A1 | 10/2011 | Krokoszinski |
| 2012/0247548 A1 | 10/2012 | Seo |
| 2012/0279547 A1 | 11/2012 | Pethe |
| 2013/0025665 A1 | 1/2013 | Lee |
| 2013/0139871 A1 | 6/2013 | Hirata et al. |
| 2013/0153025 A1 | 6/2013 | Hahn et al. |
| 2014/0048130 A1 | 2/2014 | Lih |
| 2015/0214398 A1 | 7/2015 | Watahiki et al. |
| 2016/0155866 A1 | 6/2016 | Ha et al. |
| 2017/0047459 A1 | 2/2017 | Yi |
| 2017/0077321 A1 | 3/2017 | Ito |
| 2020/0052149 A1 | 2/2020 | Ito |
| 2020/0220039 A1 | 7/2020 | Chang |

FOREIGN PATENT DOCUMENTS

| | | |
|---|---|---|
| CN | 112885923 A | 6/2021 |
| CN | 112885925 A | 6/2021 |
| CN | 113045207 A | 6/2021 |
| CN | 113471321 A | 10/2021 |
| CN | 113594296 A | 11/2021 |
| CN | 114156361 A | 3/2022 |
| CN | 114171623 A | 3/2022 |
| CN | 115036375 A | 9/2022 |
| CN | 115241299 A | 10/2022 |
| EP | 4287269 A2 | 12/2023 |
| EP | 4287271 A2 | 12/2023 |
| JP | 2016103642 A | 6/2016 |
| JP | 2017038060 A | 2/2017 |
| JP | 2020167243 A | 10/2020 |
| JP | 2021501548 A | 1/2021 |
| JP | 2021057435 A | 4/2021 |
| JP | 2022035906 A | 3/2022 |
| JP | 7168800 B1 | 11/2022 |
| JP | 7239764 B1 | 3/2023 |
| KR | 20180043150 A | 6/2013 |
| KR | 1020130112877 A | 10/2013 |
| KR | 101740524 B1 | 6/2017 |
| KR | 1020180043150 A | 4/2018 |
| WO | 2015068341 A1 | 5/2015 |

OTHER PUBLICATIONS

Japanese Patent Office, Decision to Grant a Patent issued in corresponding Application No. 2023-180917, dated May 21, 2024, 5 pp.
Decision to Grant for corresponding Application No. 202310548868. 4, dated Jul. 1, 2023, 4 pages.
Australian Examination Report No. 1 for corresponding AU Application No. 2023251504, dated Apr. 12, 2024, 3 pages.
Australian Examination Report No. 1 for corresponding AU Application No. 2023251513, dated Apr. 12, 2024, 2 pages.
European Search Report for corresponding EP Application No. 23204939.5, dated Mar. 25, 2024, 5 pages.
Japanese Office Action for corresponding JP Application No. 2023180917, dated Dec. 26, 2023, 4 pages.
European Search Report for corresponding EP Application No. 23204895.9, dated Mar. 19, 2024, 10 pages.

SOLAR CELL, METHOD FOR MANUFACTURING THE SAME, PHOTOVOLTAIC MODULE, AND PHOTOVOLTAIC SYSTEM

CROSS-REFERENCE TO RELATED APPLICATION

This application is a continuation of U.S. application Ser. No. 18/386,531, filed on Nov. 2, 2023, which claims priority to Chinese patent application No. 202310548868.4, filed on May 16, 2023, and titled "SOLAR CELL, METHOD FOR MANUFACTURING THE SAME, PHOTOVOLTAIC MODULE, AND PHOTOVOLTAIC SYSTEM". The contents of the above identified applications are hereby incorporated herein in their entireties by reference.

TECHNICAL FIELD

The present application relates to the technical field of solar cells, in particular to a solar cell, a method for manufacturing the same, a photovoltaic module, and a photovoltaic system.

BACKGROUND

As photovoltaic technology develops rapidly, the conversion efficiency of crystalline silicon solar cells has improving year by year. Currently, tunnel oxide passivated contact (TOPCon) solar cells come to the fore owing to their advantages such as high efficiency and well-established industrial manufacturing processes. Many manufacturers in the industry have intensified their research and development efforts on TOPCon cells.

SUMMARY

In view of this, there is a need to provide a solar cell with relatively high efficiency, a method for manufacturing the same, a photovoltaic module, and a photovoltaic system.

A first aspect of the embodiments of the present application provides a solar cell. The solar cell includes a substrate, a doped conducting layer, a first passivation layer, a passivating contact layer, and a second passivation layer. The substrate includes a first surface, a second surface, and a plurality of first side surfaces. The first surface and the second surface are opposite to each other. The plurality of first side surfaces are adjacent to and between the first surface and the second surface. At least the first surface and a portion of the first side surface of the substrate include a textured structure. The doped conducting layer is disposed at least on the first surface and the portion of the first side surface to cover the textured structure. The first passivation layer is stacked on the doped conducting layer and covers the first surface and at least the portion of the first side surface, so as to cover at least the doped conducting layer. The passivating contact layer is disposed on the second surface. The second passivation layer is stacked on the passivating contact layer and covers the second surface, so as to cover the passivating contact layer.

In some embodiments, the first side surface includes a textured region provided with the textured structure and a flat region adjacent to the textured region. On the first side surface, the first passivation layer completely covers the textured region and covers at least a portion of the flat region.

In some embodiments, an edge of the first passivation layer away from the first surface is flush with a surface of the passivating contact layer away from the substrate.

In some embodiments, the substrate further includes at least one cut edge side surface adjacent to and between the first surface and the second surface. Only the first surface and the portion of the first side surface include the textured structure. The doped conducting layer is only disposed on the first surface and the portion of the first side surface to cover the textured structure.

In some embodiments, in the normal direction of the cut edge side surface, the cut edge side surface is flush with edges of the doped conducting layer, the first passivation layer, the passivating contact layer, and the second passivation layer located on the same side as the cut edge side surface.

In some embodiments, the first passivation layer further at least partially covers the cut edge side surface.

In some embodiments, the second passivation layer further at least partially covers the cut edge side surface, so as to cover at least a portion of the first passivation layer located on the cut edge side surface.

In some embodiments, the substrate further includes at least one cut edge side surface adjacent to and between the first surface and the second surface. At least a portion of the cut edge side surface includes the textured structure. The doped conducting layer is disposed on the first surface, the portion of the first side surface, and the portion of the cut edge side surface to cover the textured structure. The first passivation layer further covers at least the portion of the cut edge side surface to cover at least the doped conducting layer.

In some embodiments, the second passivation layer further at least partially covers the cut edge side surface, so as to cover at least a portion of the first passivation layer located on the cut edge side surface.

In some embodiments, the second passivation layer further at least partially covers the first side surface, so as to cover at least a portion of the first passivation layer located on the first side surface.

In some embodiments, the first side surface includes a textured region provided with the textured structure and a flat region adjacent to the textured region. The first passivation layer includes a first portion located on the first side surface, and the first portion covers the flat region. The second passivation layer covers at least the first portion.

In some embodiments, the first passivation layer further includes a second portion located on the first side surface, and the second portion covers the textured region. The second passivation layer covers the first portion and at least a portion of the second portion.

In some embodiments, an edge of the second passivation layer away from the second surface is flush with an outer surface of the first passivation layer located on the first surface.

In some embodiments, the textured structure of the first surface and the textured structure of the first side surface form a continuous structure. Alternatively, the textured structure of the first surface is spaced from the textured structure of the first side surface.

In some embodiments, the first passivation layer includes a first passivation film and a first anti-reflection film stacked on the doped conducting layer; and/or the second passivation layer includes at least one second anti-reflection film stacked on the passivating contact layer.

A second aspect of the embodiments of the present application provides a method for manufacturing a solar cell. The method includes the following steps:

provides a wafer, wherein the wafer includes a substrate and a doped conducting layer, the substrate includes a first surface, a second surface, and a plurality of first side surfaces, the first surface and the second surface are opposite to each other, and the plurality of first side surfaces are adjacent to and between the first surface and the second surface, at least the first surface and a portion of the first side surface of the substrate include a textured structure, the doped conducting layer is disposed at least on the first surface and the portion of the first side surface, thereby covering the textured structure;

forming a passivating contact layer on the second surface of the substrate;

forming a first passivation layer on the doped conducting layer, wherein the first passivation layer covers the first surface and at least the portion of the first side surface, so as to cover at least the doped conducting layer; and forming a second passivation layer on the passivating contact layer, thereby forming a solar cell matrix, wherein the second passivation layer covers the second surface, so as to cover the passivating contact layer.

In some embodiments, after forming the second passivation layer on the passivating contact layer, the method further includes a step of laser cutting the solar cell matrix along the thickness direction to form at least two solar cells.

In some embodiments, the step of providing the wafer includes:

performing texturing treatment and diffusion of dopant elements to at least the first surface and the first side surface of the substrate; and etching the substrate to expose the second surface and a first target region of each first side surface;

wherein the first target region is adjacent to and connected to the second surface.

In some embodiments, the step of providing the wafer includes:

cutting a substrate blank along the thickness direction to form the substrate and a cut edge side surface of the substrate;

performing texturing treatment and diffusion of dopant elements to at least the first surface, the first side surface, and the cut edge side surface of the substrate; and etching the substrate to expose the second surface, a first target region of each first side surface, and a second target region of each cut edge side surface of the substrate, so as to form the textured structure and the doped conducting layer covering the textured structure on the first surface, the portion of the first side surface, and a portion of the cut edge side surface of the substrate;

wherein the first target region is adjacent to the second surface, and the second target region is adjacent to the second surface.

In some embodiments, the step of forming the passivating contact layer on the second surface of the substrate includes:

sequentially forming a tunnel material layer, a doped polysilicon material layer, and an oxide material layer on each surface of the wafer;

etching to remove the oxide material layer on a surface of a first side of the wafer and on each side surface of the wafer; and etching to remove the doped polysilicon material layer and the tunnel material layer on the surface of the first side of the wafer and on the each side surface of the wafer;

wherein the surface of the first side of the wafer corresponds to the first surface of the substrate.

In some embodiments, the step of forming the passivating contact layer on the second surface of the substrate includes:

forming a passivating contact material layer on each surface of the wafer;

cutting the wafer formed with the passivating contact material layer along the thickness direction of the substrate to form the cut edge side surface of the substrate; and etching to remove the passivating contact material layer disposed outside the second surface of the substrate, thereby forming the passivating contact layer.

In some embodiments, after the step of forming the second passivation layer on the passivating contact layer, the method further includes a step of respectively forming electrodes on the first passivation layer and the second passivation layer.

A third aspect of the embodiments of the present application provides a photovoltaic module, including at least one cell group. The cell group includes at least two connected above-described solar cells.

A fourth aspect of the embodiments of the present application provides a photovoltaic system, including the above-described photovoltaic module.

A fifth aspect of the embodiments of the present application provides a method for manufacturing a solar cell. The method includes the following steps:

providing a wafer, wherein the wafer includes a substrate and a doped conducting material layer, the substrate includes a first surface, a second surface, and a plurality of first side surfaces, the first surface and the second surface are opposite to each other, the plurality of first side surfaces are adjacent to and between the first surface and the second surface, the first surface and a portion of the first side surface of the substrate include a textured structure, the doped conducting material layer is disposed on the first surface and the portion of the first side surface to cover the textured structure;

forming a passivating contact material layer on each surface of the wafer;

cutting the wafer formed with the passivating contact material layer along the thickness direction of the substrate to form at least two sub-wafers, so as to cut the doped conducting material layer into doped conducting layers;

etching to remove the passivating contact material layer on a surface of a first side of the sub-wafer and on each side surface of the sub-wafer, thereby forming a passivating contact layer on the sub-wafer, wherein the surface of the first side of the sub-wafer corresponds to the first surface of the substrate; and forming a first passivation layer on the doped conducting layer, wherein the first passivation layer covers the first surface and at least the portion of the first side surface, so as to cover at least the doped conducting layer, and the first passivation layer further covers at least a portion of a cut edge side surface, the cut edge side surface is a side surface of the sub-wafer formed by cutting the wafer.

In some embodiments, the step of providing the wafer includes:

performing texturing treatment and diffusion of dopant elements to at least the first surface and the first side surface of the substrate; and etching the substrate to expose the second surface and a first target region of each first side surface of the substrate;

wherein the first target region is adjacent to and connected to the second surface.

In some embodiments, the step of etching the substrate to expose the second surface and the first target region of each first side surface of the substrate includes:

etching the substrate subjected to the texture treatment and the diffusion of dopant elements to expose the texture structure in the second surface and the first target region; and etching to remove the exposed textured structure, so as to expose the second surface and the first target region of each first side surface of the substrate.

In some embodiments, the step of forming the passivating contact material layer on each surface of the wafer includes a step of sequentially forming a tunnel material layer, a doped polysilicon material layer, and an oxide material layer on each surface of the wafer.

In some embodiments, the step of etching to remove the passivating contact material layer on the surface of the first side of the sub-wafer and on each side surface of the sub-wafer to form the passivating contact layer on the sub-wafer includes:

etching to remove the oxide material layer on the surface of the first side of the sub-wafer and on each side surface of the sub-wafer, etching to remove the doped polysilicon material layer and the tunnel material layer on the surface of the first side of the sub-wafer and on each side surface of the sub-wafer; and etching to polish the cut edge side surface of the sub-wafer.

In some embodiments, the step of etching to remove the oxide material layer is performed by using a continuous-type machine; the step of etching to remove the doped polysilicon material layer and the tunnel material layer is performed by using a trough-type machine.

In some embodiments, after the step of etching to remove the doped polysilicon material layer and the tunnel material layer on the surface of the first side of the sub-wafer and on each side surface of the sub-wafer, the method further includes:

etching to remove the oxide material layer on a surface of a second side of the sub-wafer;

wherein the surface of the second side of the sub-wafer corresponds to the second surface of the substrate.

In some embodiments, after the step of forming the first passivation layer on the doped conducting layer, the method further includes:

forming a second passivation layer on the passivating contact layer;

wherein the second passivation layer at least covers the second surface, at least a portion of the first side surface, and at least a portion of the cut edge side surface, so as to cover the passivating contact layer and at least a portion of the first passivation layer.

In some embodiments, after the step of forming the second passivation layer on the passivating contact layer, the method further includes:

respectively forming electrodes on the first passivation layer and the second passivation layer, thereby forming the solar cell.

In some embodiments, the step of cutting the wafer formed with the passivating contact material layer along the thickness direction of the substrate to form the sub-wafers includes:

laser cutting the wafer formed with the passivating contact material layer along the thickness direction of the substrate to form the sub-wafer.

A sixth aspect of the embodiments of the present application provides a solar cell. The solar cell includes a substrate, a doped conducting layer, a first passivation layer, a passivating contact layer, and a second passivation layer. The substrate includes a first surface, a second surface and at least one first side surface. The first surface the second surface are opposite to each other, and the at least one first side surface is adjacent to and between the first surface and the second surface. At least the first surface and a portion of the first side surface of the substrate include a textured structure. The doped conducting layer is disposed at least on the first surface and the portion of the first side surface to cover the textured structure. The first passivation layer is stacked on the doped conducting layer and covers the first surface and at least the portion of the first side surface, so as to cover at least the doped conducting layer. The passivating contact layer is disposed on the second surface. The second passivation layer is stacked on the passivating contact layer and covers the second surface, so as to cover the passivating contact layer.

A seventh aspect of the embodiments of the present application provides a method for manufacturing a solar cell. The method includes the following steps:

providing a wafer, wherein the wafer includes a substrate and a doped conducting layer; the substrate includes a first surface, a second surface, and at least one first side surface, the first surface and the second surface are opposite to each other, and the at least one first side surface is adjacent to and between the first surface and the second surface, the first surface and at least a portion of the first side surface of the substrate include a textured structure, the doped conducting layer is disposed at least on the first surface and the portion of the first side surface to cover the textured structure;

forming a passivating contact layer on the second surface of the substrate;

forming a first passivation layer on the doped conducting layer, wherein the first passivation layer covers the first surface and at least the portion of the first side surface, so as to cover at least the doped conducting layer, and forming a second passivation layer on the passivating contact layer, thereby forming a solar cell matrix, wherein the second passivation layer covers the second surface, so as to cover the passivating contact layer.

An eighth aspect of the embodiments of the present application provides a method for manufacturing a solar cell. The method includes the following steps:

providing a wafer, wherein: the wafer includes a substrate and a doped conducting material layer, the substrate includes a first surface, a second surface, and at least one first side surface, the first surface and the second surface are opposite to each other, the at least one first side surface is adjacent to and between the first surface and the second surface, the first surface and at least a portion of the first side surface of the substrate include a textured structure, the doped conducting material layer is disposed on the first surface and at least the portion of the first side surface to cover the textured structure;

forming a passivating contact material layer on each surface of the wafer;

cutting the wafer formed with the passivating contact material layer along the thickness direction of the substrate to form sub-wafers, so as to cut the doped conducting material layer into doped conducting layers;

etching to remove the passivating contact material layer on a surface of a first side of the sub-wafer and on each side surface of the sub-wafer, thereby forming a passivating contact layer on the sub-wafer, wherein the surface of the first side of the sub-wafer corresponds to the first surface of the substrate; and forming a first passivation layer on the doped conducting layer, wherein the first passivation layer covers the first surface and at least the portion of the first side surface, so as to cover at least the doped conducting layer; and the first passivation layer further covers at least a portion of the cut edge side surface, the cut edge side surface is a side surface of the sub-wafer formed by cutting the wafer.

In the solar cell according to the embodiments of the present application, the first surface and a portion of the first side surface of the substrate include a textured structure. The doped conducting layer is disposed on the first surface and the portion of the first side surface of the substrate, so as to cover the textured structure. Since the portion of the first side surface has the textured structure and the doped conducting layer is disposed on the textured structure, the doped conducting layer on this region is conducive to reducing recombination of carriers at interface at the first side surface, thereby achieving relatively good passivation effect on the first side surface. In addition, the textured structure in the first side surface increases the light absorption area of the solar cell, increasing the photogenerated current of the solar cell, which is conducive to the efficiency of the solar cell.

In the solar cell according to the embodiments of the present application, the first passivation layer is stacked on the doped conducting layer. The first passivation layer covers the first surface and at least a portion of the first side surface, so as to at least cover the doped conducting layer. Since the first passivation layer covers the first surface and at least a portion of the first side surface, at least a portion of the first side surface is protected by the first passivation layer, which not only increases the passivation effect on the first side surface, but also alleviates the recombination of carriers at the first side surface. In addition, the first passivation layer is an insulating layer, which effectively prevents leakage currents at the first side surface, thereby increasing the output power while improving the conversion efficiency of the solar cell.

REFERENCE SIGNS

Figure 1:
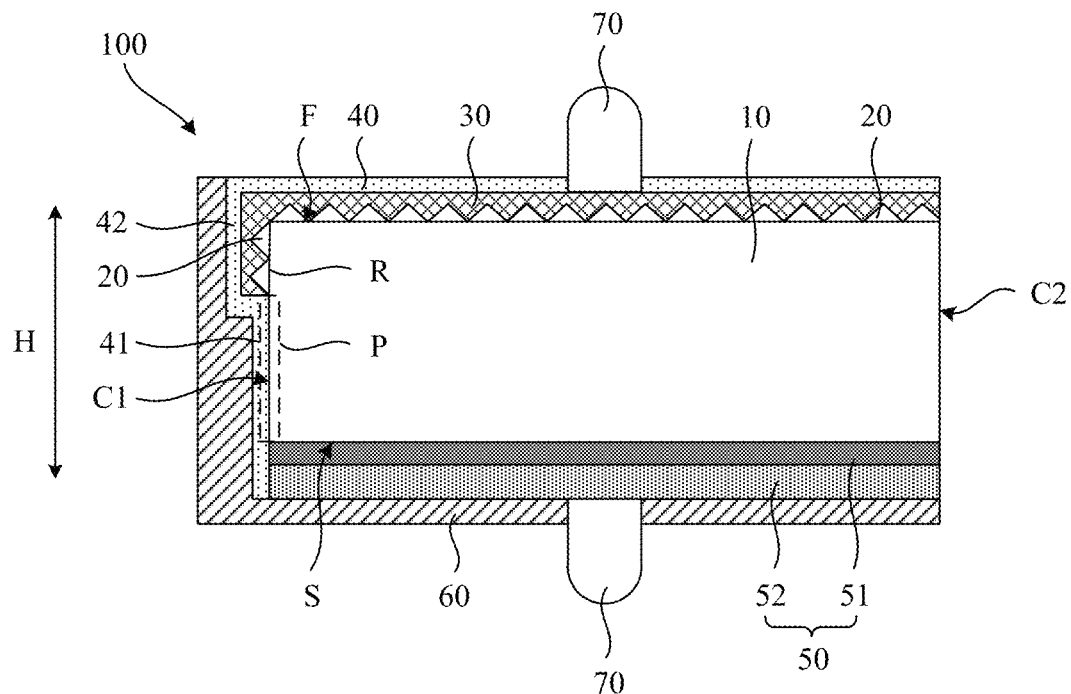
FIG. 1 is a structural schematic view of a solar cell provided in an embodiment of the present application.

100. Solar cell; 101, 101', wafer; 102, sub-wafer; 103, solar cell matrix; F, first surface; S, second surface; C1, first side surface; C11, first target region; C12, second target region; C2, cut edge side surface; CQ, cut surface; P, flat region; R, textured region; H, thickness direction of a substrate; 10, substrate; 11, boundary line; 20, textured structure; 30, doped conducting layer; 30', doped conducting material layer; 40, first passivation layer; 41, first portion; 42, second portion; 50, passivating contact layer; 51, tunnel oxide layer; 52, doped polysilicon conducting layer; 60, second passivation layer; 70, electrode; 200, photovoltaic module; 210, cell group.

DETAILED DESCRIPTION

In order to make the above objects, features and advantages of the present application more comprehensible, specific embodiments of the present application are described in detail below with reference to the drawings. In the following description, many specific details are set forth to make the present application fully understandable. However, the present application can be implemented in many other ways different from those described herein. Similar improvements can be made by those skilled in the art without departing from the spirit of the present application. The present application is not limited to the specific embodiments disclosed below.

In the description of the present application, it should be understood that the terms "center", "longitudinal", "transverse", "length", "width", "thickness", "upper", "lower", "front", "back", "left", "right", "vertical", "horizontal", "top", "bottom", "inner", "outer", "clockwise", "counter-clockwise", "axial", "radial", "circumferential" etc. indicate the orientations or positional relationships on the basis of the drawings. These terms are only for the convenience of describing the present application and simplifying the description, rather than indicating or implying that the related devices or element must have the specific orientations, or be constructed or operated in the specific orientations, and therefore cannot be understood as limitations of the present application.

In addition, the terms "first" and "second" are only used for descriptive purposes and cannot be understood as indicating or implying relative importance or implicitly indicating the quantity or order of the indicated technical features. Therefore, the features modified by "first" or "second" may explicitly or implicitly include at least one of the features. In the description of the present application, the "plurality" means at least two, such as two, three, etc., unless otherwise specifically defined.

In the present application, unless otherwise clearly specified and defined, the terms "installed", "connected", "coupled", "fixed" and the like should be understood broadly. For example, an element, when being referred to as being "installed", "connected", "coupled", or "fixed" to another element, unless otherwise specifically defined, may be fixedly connected, detachably connected, or integrated to the other element, may be mechanical connected or electrically connected to the other element, and may be directly connected to the other element or connected to the other element via an intermediate medium. For those skilled in the art, the specific meanings of the above terms in the present application can be understood according to specific circumstances.

In the present application, unless otherwise specifically defined, a first feature, when being referred to as being located "on" or "under" a second feature, may be in direct contact with the second feature in indirect contact with the second feature via an intermediate medium. Moreover, a first feature, when being referred to as being located "on", "above", "over" a second feature, may be located right above or obliquely above the second feature, or merely located at a horizontal level higher than the second feature. A first feature, when being referred to as being located "under", "below", "beneath" a second feature, may be located right below or obliquely below the second feature, or merely located at a horizontal level lower than the second feature.

It should be noted that an element, when being referred to as being "fixed" or "mounted" to another element, may be directly fixed or mounted to the other element or via an intermediate element. An element, when being referred to as being "connected" to another element, may be directly connected to the other element or via an intermediate element. Such terms as "vertical", "horizontal", "up", "down", "left", "right" and the like used herein are for illustrative purposes only and are not meant to be the only ways for implementing the present application.

The embodiments of the solar cell, the method for manufacturing the same, the photovoltaic module, and the photovoltaic system of the present application will be described below with reference to the drawings. In the present application, unless otherwise specified, the term "cover" means partially or completely covering.

Referring to FIG. 1, an embodiment of the present application provides a solar cell 100. The solar cell 100 includes a substrate 10, a doped conducting layer 30, a first passivation layer 40, a passivating contact layer 50, and a second passivation layer 60. The substrate 10 includes a first surface F, a second surface S, and at least one first side surface C1. The first surface F and the second surface S are opposite to each other. The at least one first side surface C1 is adjacent to and between the first surface F and the second surface S.

The substrate 10 is configured to receive incident light and generate photogenerated carriers. For example, the solar cell 100 can be a TOPCon cell, and both the first surface F and the second surface S of the substrate 10 can be used to receive incident light. In some embodiments, the substrate 10 further includes at least one cut edge side surface C2 adjacent to and between the first surface F and the second surface S. The cut edge side surface C2 is a side surface formed by cutting a larger substrate.

In the embodiment of the present application, at least the first surface F and a portion of the first side surface C1 of the substrate 10 is formed with the textured structure 20. The doped conducting layer 30 is disposed on at least the first surface F and a portion of the first side surface C1 to cover the textured structure 20. For example, the doped conducting layer 30 completely covers the textured structure 20. The first passivation layer 40 is stacked on the doped conducting layer 30. The first passivation layer 40 covers at least the first surface F and a portion of the first side surface C1, so as to cover at least the doped conducting layer 30. For example, the first passivation layer 40 completely covers the doped conducting layer 30. The passivating contact layer 50 is disposed on the second surface S. The second passivation layer 60 is stacked on the passivating contact layer 50. The second passivation layer 60 covers the second surface S, so as to cover the passivating contact layer 50. For example, the second passivation layer 60 completely covers the passivating contact layer 50.

In the production of TOPCon cells in related art, the front and back of the cells both involve doping processes to improve the lateral carrier transport capabilities. However, this approach also leads to a large amount of carrier recombination at the sides of the cells, causing potential leakage issues and an overall reduction in the efficiency of the conventional solar cells. In the embodiments of the present application, the first surface F and a portion of the first side surface C1 of the substrate 10 include textured structures 20. The doped conducting layer 30 is disposed on the first surface F and a portion of the first side surface C1 to cover the textured structure 20. Since a portion of the first side surface C1 is formed with the textured structure 20 and the doped conducting layer 30 is disposed on the textured structure 20, the doped conducting layer 30 on this region is conducive to reducing the recombination of carriers at interface at the first side surface C1, thereby achieving a relatively good passivation effect on the first side surface C1. In addition, the textured structure 20 in the first side surface C1 increases the light absorption area of the solar cell 100, thereby increasing the photogenerated current of the solar cell 100, which is conducive to improving the efficiency of the solar cell 100.

On the other hand, the first passivation layer 40 is stacked on the doped conducting layer 30. The first passivation layer 40 covers the first surface F and at least a portion of the first side surface C1, so as to cover at least the doped conducting layer 30. Since the first passivation layer 40 covers the first surface F and at least a portion of the first side surface C1, the first passivation layer 40 provides a protection for at least a portion of the first side surface C1, which not only increases the passivation effect on the first side surface C1, but also alleviates the recombination of carriers at the first side surface C1. In addition, the first passivation layer 40 is an insulating layer, which effectively prevents leakage currents at the first side surface C1, thereby increasing the output power of the solar cell 100 while improving the conversion efficiency of the solar cell 100.

In some embodiments, the solar cell 100 further includes at least two electrodes 70. The at least two electrodes 70 are respectively disposed at both the first surface F side and the second surface S side of the substrate 10. The electrode 70 at the first surface F side of the substrate 10 penetrates the first passivation layer 40 and is in contact with the doped conducting layer 30, so as to be electrically connected to the doped conducting layer 30 and spaced from the substrate 10. The electrode 70 at the second surface S side of the substrate 10 penetrates the second passivation layer 60 and is in contact with the passivating contact layer 50, so as to be electrically connected to the passivating contact layer 50 and spaced from the substrate 10.

In the embodiments of the present application, the first surface F and the second surface S of the substrate 10 can be, for example, two end surfaces in the thickness direction H of the substrate 10. The substrate 10 includes a plurality of side surfaces adjacent to and between the first surface F and the second surface S. The plurality of side surfaces are arranged around the first surface F and are connected one after another in sequence. The two ends of each side surface are respectively connected to the first surface F and the second surface S. One, more, or all of the plurality of side surfaces can be the first side surface(s) C1. Except the first side surface(s) C1, the remaining side surface(s) of the substrate 10 can be the cut edge side surface(s) C2. In some embodiments, the substrate 10 includes both the first side surface(s) C1 and the cut edge side surface(s) C2. The first side surface(s) C1 and the cut edge side surface(s) C2 can be arranged around the first surface F and connected one after another in sequence. In some embodiments, the substrate 10 is quadrangular in the top view. The total number of the first side surface(s) C1 and the cut edge side surface(s) C2 is four. The substrate 10 can be in other shapes as required. In some embodiments, the first side surface(s) C1 and the cut edge side surface(s) C2 are opposite to each other. In an example, all the first side surfaces C1 can be connected one after another and then connected to the cut edge side surfaces C2. In another example, the first side surfaces C1 and the cut edge side surfaces C2 can be arranged alternately. Of course, the present application is not limited thereto, and the relative positions of the first side surface(s) C1 and the cut edge side surface(s) C2 can be set as required.

The first surface F and a portion of the first side surface C1 of the substrate 10 have the textured structure 20. The textured structure 20 located in the first side surface C1 can be adjacent to the first surface F. In some embodiments, the textured structure 20 of the first surface F of the substrate 10 is connected to the textured structure 20 of the first side surface C1 of the substrate 10, forming a continuous textured structure. In some other embodiments, the textured structure 20 of the first surface F of the substrate 10 can be spaced from the textured structure 20 of the first side surface C1 of the substrate 10, forming a discontinuous textured structure.

The solar cell 100 can be an N-type cell or a P-type cell. In the N-type cell, the substrate 10 is doped with N-type elements, and the doped conducting layer 30 is doped with P-type elements. In the P-type cell, the substrate 10 is doped with P-type elements, and the doped conducting layer 30 is doped with N-type elements. The doped conducting layer 30 is adapted to form a PN junction with the substrate 10. In the embodiments of the present application, the N-type substrate 10 is taken as an example for description. In this case, the doped conducting layer 30 can be doped with P-type elements. For example, the doped conducting layer 30 can be doped with boron elements, and is also referred to as a P+ type emitter.

A portion of the doped conducting layer 30 is disposed on the first surface F, and another portion of the doped conducting layer 30 is disposed on a portion of the first side surface C1. The doped conducting layer 30 extends to cover at least entire of the textured structure 20. In some embodiments, the coverage range of the doped conducting layer 30 can be larger than the coverage range of the textured structure 20. In some embodiments, the coverage range of the doped conducting layer 30 is identical to the coverage range of the textured structure 20. That is, the doped conducting layer 30 only and completely covers the textured structure 20.

Referring still to FIG. 1, the passivating contact layer 50 is disposed on the second surface S of the substrate 10. For example, the passivating contact layer 50 can be directly stacked on the second surface S of the substrate 10. The passivating contact layer 50 can reduce the recombination of carriers at the second surface S of the substrate 10, thereby increasing the open circuit voltage of the solar cell 100 and improving the photoelectric conversion efficiency of the solar cell 100. The passivating contact layer 50 can include a tunnel oxide layer 51 and a doped polysilicon conducting layer 52 which are stacked on the second surface S in sequence. Exemplarily, the tunnel oxide layer 51 is adapted to provide an interface passivation for the second surface S of the substrate 10, achieving chemical passivation. Specifically, by saturating the dangling bonds on the surface of the substrate 10 and reducing the interface defect state density at the second surface S of the substrate 10, the recombination center at the second surface S of the substrate 10 can be reduced, and thus the recombination of carriers is reduced. The material of the tunnel oxide layer 51 can be a dielectric material, such as at least one of silicon oxide, magnesium fluoride, amorphous silicon, polysilicon, silicon carbide, silicon nitride, silicon oxynitride, aluminum oxide, or titanium oxide. In some embodiments, the electrode 70 located on the second surface S of the substrate 10 can be in contact with only the doped conducting layer 52 made of polysilicon and is spaced from the substrate 10 and the tunnel oxide layer 51 by the polysilicon doped conducting layer 52.

The first passivation layer 40 is stacked on the doped conducting layer 30. The first passivation layer 40 is configured for surface passivation and anti-reflection for the solar cell 100. The first passivation layer 40 can effectively chemical passivate the dangling bonds on the surface of the substrate 10, and also reduce reflection at the front side of the solar cell 100.

Exemplarily, the first passivation layer 40 includes a first passivation film (not shown) and a first anti-reflection film (not shown), which are stacked on the doped conducting layer 30 in sequence.

The first anti-reflection film is located on the first surface side of the substrate 10, which is also the side of the solar cell 100 that receives incident light (also referred to as a front side or a light-receiving side). The first anti-reflection film provides anti-reflection effect on the front side of the solar cell 100. The first anti-reflection film can be a multi-layer structure. In the multi-layer structured first anti-reflection film, the layers can be made of one or more of silicon oxide, silicon nitride, or silicon oxynitride.

The first passivation film can be a single-layer structure or a multi-layer structure. The material of the first passivation film can be at least one of aluminum oxide, silicon oxide, silicon nitride, or silicon oxynitride. In addition, the first passivation film can be formed by chemical deposition.

The first passivation layer 40 at least covers the first surface F and at least a portion of the first side surface C1, so as to at least cover the doped conducting layer 30. Specifically, the first passivation layer 40 can continuously cover the first surface F and at least a portion of the first side surface C1 adjacent to the first surface F, so as to cover the doped conducting layer 30. In this case, the first passivation layer 40 includes one portion covering the first surface F and another portion extending to the first side surface C1 continuously from the portion covering the first surface F.

The second passivation layer 60 is stacked on the passivating contact layer 50. The second passivation layer 60 can be a single-layer structure or a multi-layer structure. The material of the second passivation layer 60 can be one or more of silicon oxide, silicon nitride, or silicon oxynitride. In addition, the second passivation layer 60 is disposed on the back side of the solar cell 100 (i.e., the side away from the sun). With the development of the technology of the solar cell 100, the back side of the solar cell 100 also can make use of light energy, mainly from the reflected light or scattered light in the surrounding environment. The second passivation layer 60 includes at least one second anti-reflection film (not shown) stacked on the passivating contact layer 50. In this way, the light reflectance at the back side of the solar cell 100 can be reduced, and the light absorbance at the back surface of the solar cell 100 can be increased, so that the second passivation layer 60 can have both passivation effect and anti-reflection effect.

Figure 2:
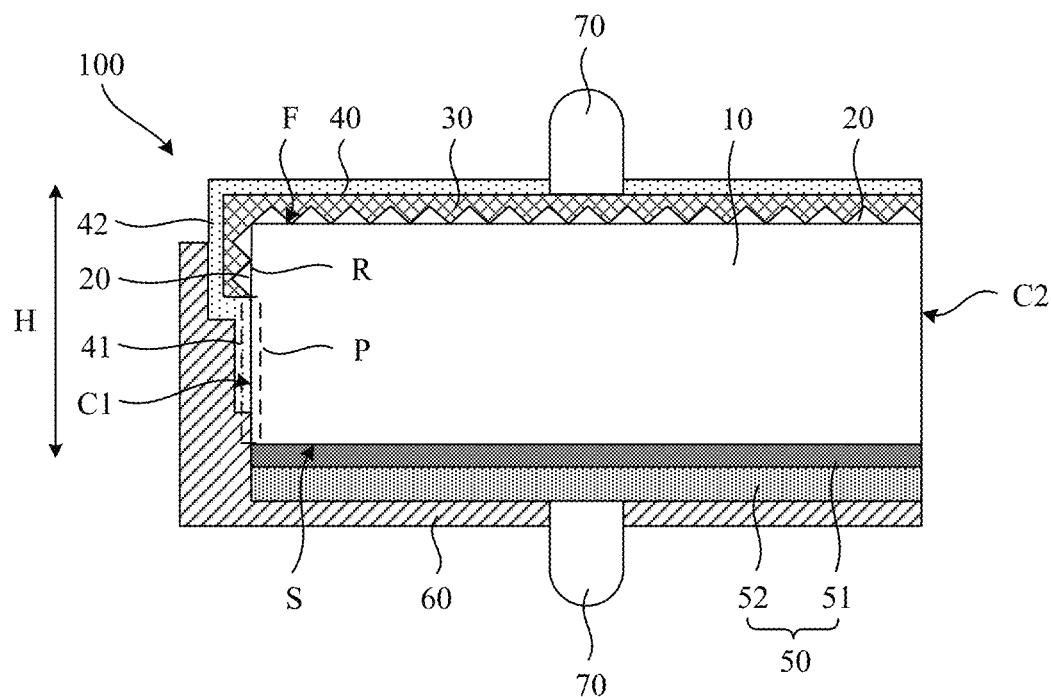
FIG. 2 is a structural schematic view of a solar cell provided in an embodiment of the present application.

In some embodiments, referring to FIG. 1 and FIG. 2, the first side surface C1 includes a textured region R provided with a textured structure 20, and a flat region P adjacent to the textured region R. The flat region P herein refers to the region of the first side surface C1 without the textured structure 20. In some embodiments, the textured region R is adjacent to the first surface F. The flat region P is away from the first surface F.

In some embodiments, as mentioned above, the first passivation layer 40 at least covers the first surface F and at least a portion of the first side surface C1. With respect to the coverage range of the first passivation layer 40 on the first side surface C1, for example, on the first side surface C1, the edge of the first passivation layer 40 away from the first surface F is flush with the edge of the doped conducting layer 30, or the first passivation layer 40 extends beyond the edge of the doped conducting layer 30 along the thickness direction H of the substrate 10.

In the embodiment that the first passivation layer 40 extends beyond the edge of the doped conducting layer 30 along the thickness direction H of the substrate 10, the first passivation layer 40 on the first side surface C1 can cover the entire textured region R and at least a portion of the flat region P. In this way, the first passivation layer 40 provides an improved coverage and passivation effects on the first side surface C1.

The first passivation layer 40 on the first side surface C1 can cover the entire textured region R and at least a portion of the flat region P, which may be due to following facts: During the manufacture process of the solar cell 100, a portion of the first side surface C1 of the substrate 10 may be in contact with a positioning member or the like and thus prevented from having a film or a layer formed thereon, so that the first passivation layer 40 does not completely cover the first side surface C1.

FIG. 2 shows an embodiment that an edge of the first passivation layer 40 disposed on the first side surface C1 and away from the first surface F is located within the range of the flat region P. FIG. 1 shows an embodiment that an edge of the first passivation layer 40 away from the first surface F is flush with the surface of the passivating contact layer 50 away from the substrate 10.

In some embodiments, the edge of the first passivation layer 40 is flush with the edge of the doped conducting layer 30. For example, referring to FIG. 3 and FIG. 4, the first passivation layer 40 does not extend to the flat region P along the thickness direction H of the substrate 10. That is, the coverage range of the first passivation layer 40 is consistent with the coverage range of the doped conducting layer 30.

In some embodiments, the second passivation layer 60 covers at least a portion of the first side surface C1, so as to cover at least a portion of the first passivation layer 40 on the first side surface C1. Since the first passivation layer 40 covers the first surface F and at least a portion of the first side surface C1 and the second passivation layer 60 covers at least a portion of the first passivation layer 40, the first passivation layer 40 and the second passivation layer 60 together protect at least a portion of the first side surface C1, which not only increases the passivation effect on at least a portion of the first side surface C1, but also alleviates the recombination of carriers at the first side surface C1. In addition, the second passivation layer 60 is an insulating layer, which can effectively prevent leakage currents at the first side surface C1, thereby increasing the output power of the solar cell 100 while improving the conversion efficiency of the solar cell 100.

The second passivation layer 60 at least covers the second surface S and at least a portion of the first side surface C1, so as to cover the passivating contact layer 50 and at least a portion of the first passivation layer 40. Specifically, the second passivation layer 60 can continuously cover the second surface S and at least a portion of the first side surface C1 adjacent to the second surface S, so that both the passivating contact layer 50 and the first passivation layer 40 can be covered. In this case, the second passivation layer 60 includes one portion covering the second surface S and another portion extending to the first side surface C1 continuously from the portion covering the second surface S.

The coverage range of the second passivation layer 60 on the first side surface C1 is described below with reference to FIGS. 1 to 4.

In some embodiments, the first passivation layer 40 extends to pass the edge of the doped conducting layer 30 along the thickness direction H of the substrate 10. Referring to FIG. 1 and FIG. 2, the portion of the first passivation layer 40 located on the first side surface C1 can include a first portion 41 covering the flat region P, and the second passivation layer 60 can at least cover the first portion 41. In this way, it ensures that the second passivation layer 60 reliably covers the first passivation layer 40, preventing the region of the first side surface C1 between ends of the two passivation layers from being not covered by any passivation layer.

In addition, the portion of the first passivation layer 40 located on the first side surface C1 further includes a second portion 42 covering the textured region R. The second passivation layer 60 covers the first portion 41 and at least a portion of the second portion 42. In this way, the coverage range of the second passivation layer 60 on the first passivation layer 40 is relatively large, improving the passivation effect on the side surface of the solar cell 100.

As shown in FIG. 2, in some embodiments, the second passivation layer 60 covers the entire first portion 41 and a portion of the second portion 42. In other embodiments, the second passivation layer 60 only covers the first portion 41, or the second passivation layer 60 only covers the entire second portion 42.

Referring to FIG. 1, in some embodiments, on the first side surface C1, the second passivation layer 60 extends along the thickness direction H of the substrate 10, such that the edge of the second passivation layer 60 away from the second surface S is flush with the outer surface of the first passivation layer 40 on the first surface F. In this way, the passivation effect on the side surface of the solar cell 100 is improved. When the first passivation layer 40 is not well or uniformly deposited due to contact with a quartz boat or due to manufacturing issues, the increased coverage range of the second passivation layer 60 can further improve the reliability of passivation on the side surface of the solar cell 100.

Figure 3:
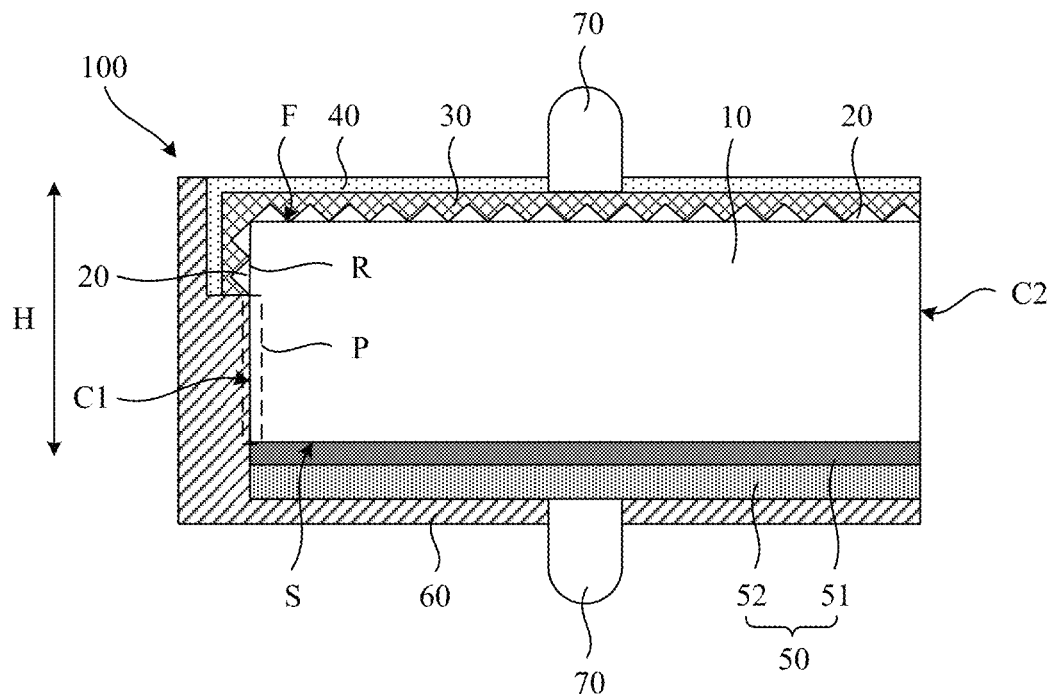
FIG. 3 is a structural schematic view of a solar cell provided in an embodiment of the present application.
Figure 4:
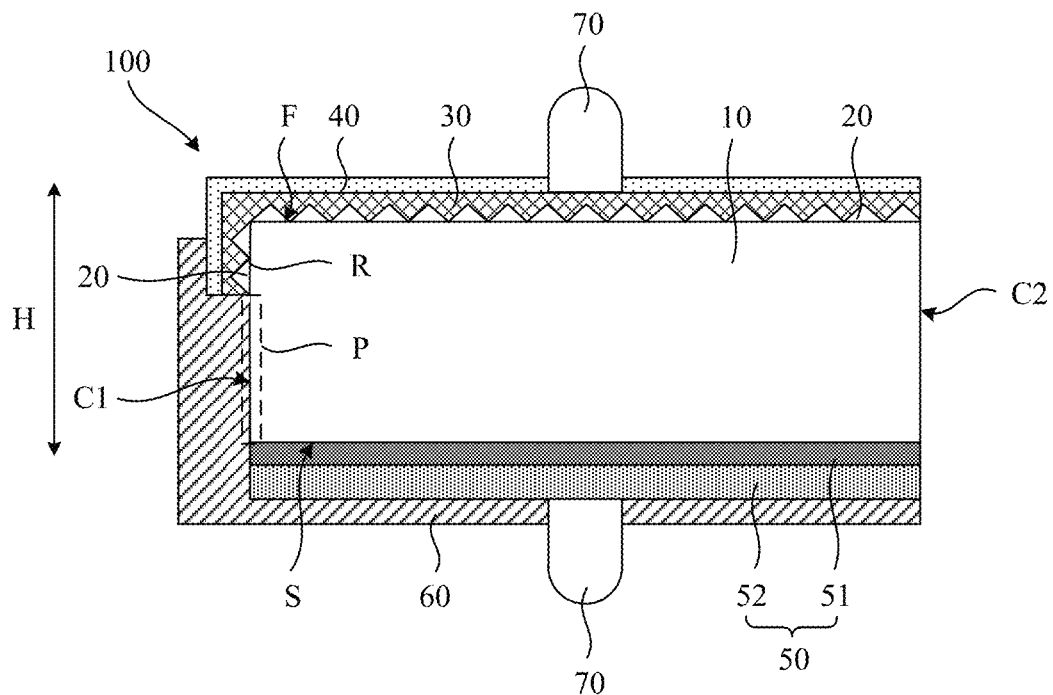
FIG. 4 is a structural schematic view of a solar cell provided in an embodiment of the present application.

Referring to FIG. 3 and FIG. 4, in some embodiments, on the first side surface C1, the edge of the first passivation layer 40 is flush with the edge of the doped conducting layer 30, and the portion of the first passivation layer 40 disposed on the first side surface C1 only covers the textured region R. In this case, the second passivation layer 60 on the first side surface C1 covers at least a portion of the textured region R. For example, as shown in FIG. 4, the second passivation layer 60 on the first side surface C1 covers a portion of the textured region R.

Alternatively, as shown in FIG. 3, the second passivation layer 60 on the first side surface C1 extends along the thickness direction H of the substrate 10, such that the edge of the second passivation layer 60 away from the second surface S is flush with the outer surface of the first passivation layer 40 on the first surface F. In this way, the passivation effect on the side surface of the solar cell 100 is improved. When the first passivation layer 40 is not well or uniformly deposited due to contact with a quartz boat or due to manufacturing issues, the increased coverage range of the second passivation layer 60 can further improve the reliability of passivation on the side surface of the solar cell 100.

The second passivation layer 60 on the first side surface C1 can cover a portion of the textured region R, which may be due to following facts: During the manufacture process of the solar cell 100, a portion of the first passivation layer 40 on the first side surface C1 or on the cut edge side surface C2 of the substrate 10 may be in contact with a positioning member or the like and thus prevented from having a film or a layer formed thereon, so that the second passivation layer 60 does not completely cover the first passivation layer 40.

In some embodiments, the substrate 10 includes at least one cut edge side surface C2 adjacent to and between the first surface F and the second surface S.

Referring to FIGS. 1 to 4, in some embodiments, the textured structure 20 is only formed in the first surface F and a portion of the first side surface C1. The doped conducting layer 30 is only disposed on the first surface F and a portion of the first side surface C1, so as to cover the textured structure 20.

Exemplarily, in the normal direction of the cut edge side surface C2, the cut edge side surface C2 is flush with the edges of the doped conducting layer 30, the first passivation layer 40, the passivating contact layer 50, and the second passivation layer 60 on the same side as the cut edge side surface C2. In this case, no film or layer is formed on the surface of the solar cell 100 corresponding to the cut edge side surface C2. Such a structure, for example, may be obtained by cutting a cell structure at the end of the manufacture process of the solar cell 100.

Referring to FIGS. 5 to 8, in some embodiments of the present application, the solar cells 100 based on the above embodiments are further improved by forming a film or layer structure on the cut edge side surface C2. It can be understood that the film or layer structures and the coverage ranges thereof on the first surface F and the first side surface C1 of the substrate 10 are the same as those in the above embodiments, which will not be repeatedly described herein.

Figure 5:
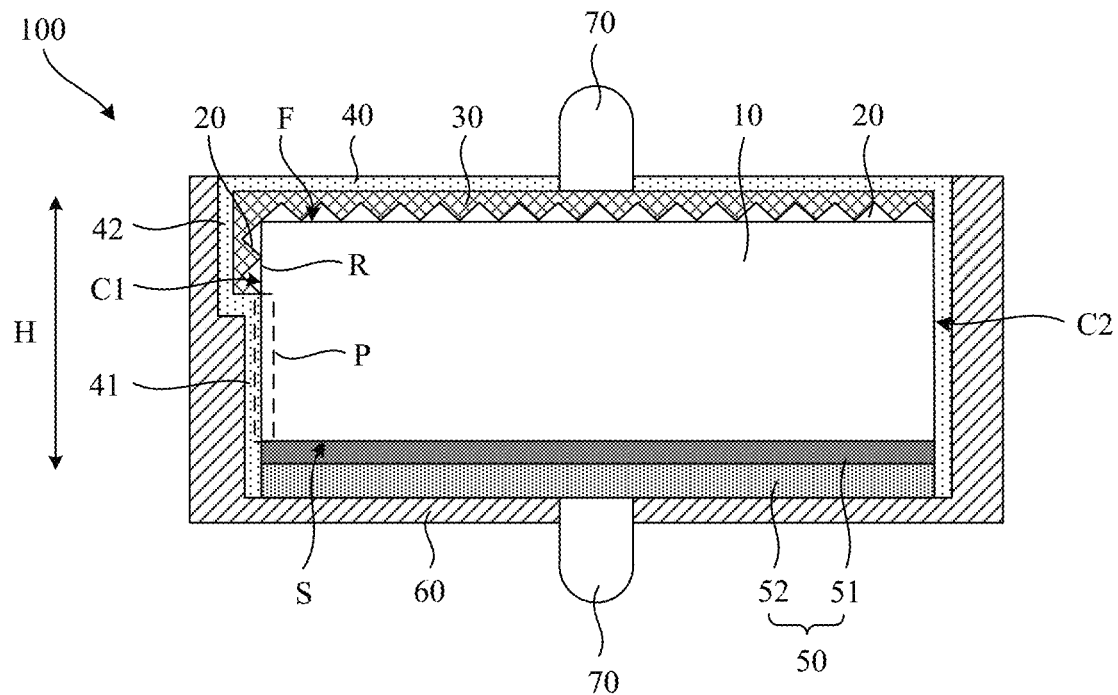
FIG. 5 is a structural schematic view of a solar cell provided in an embodiment of the present application.
Figure 6:
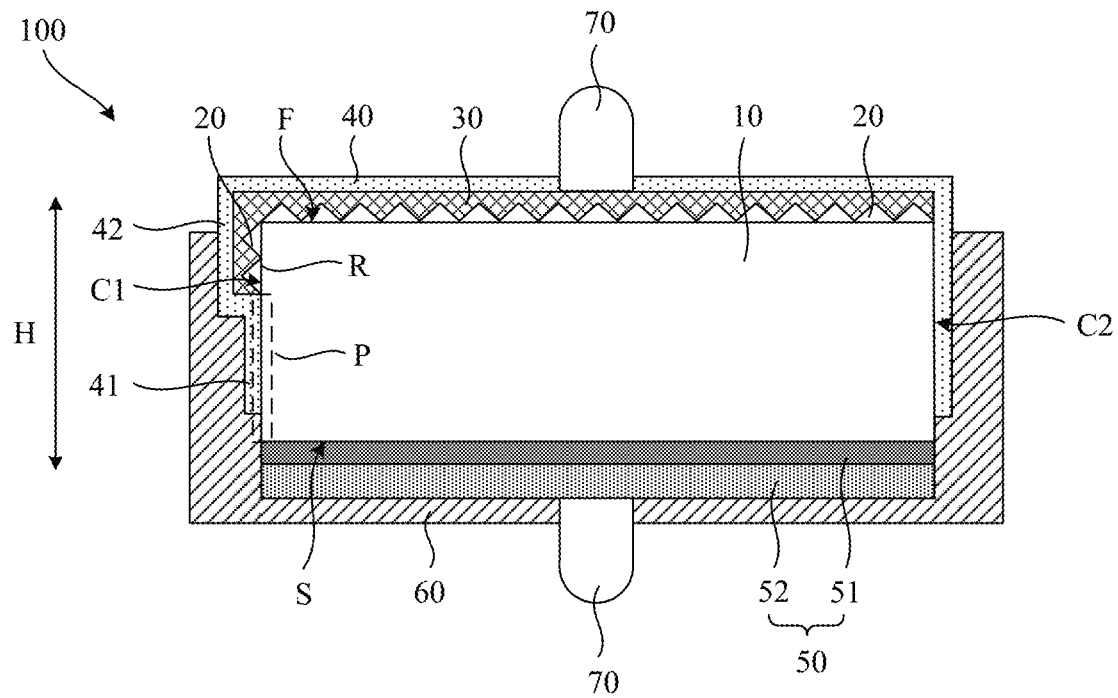
FIG. 6 is a structural schematic view of a solar cell provided in an embodiment of the present application.
Figure 7:
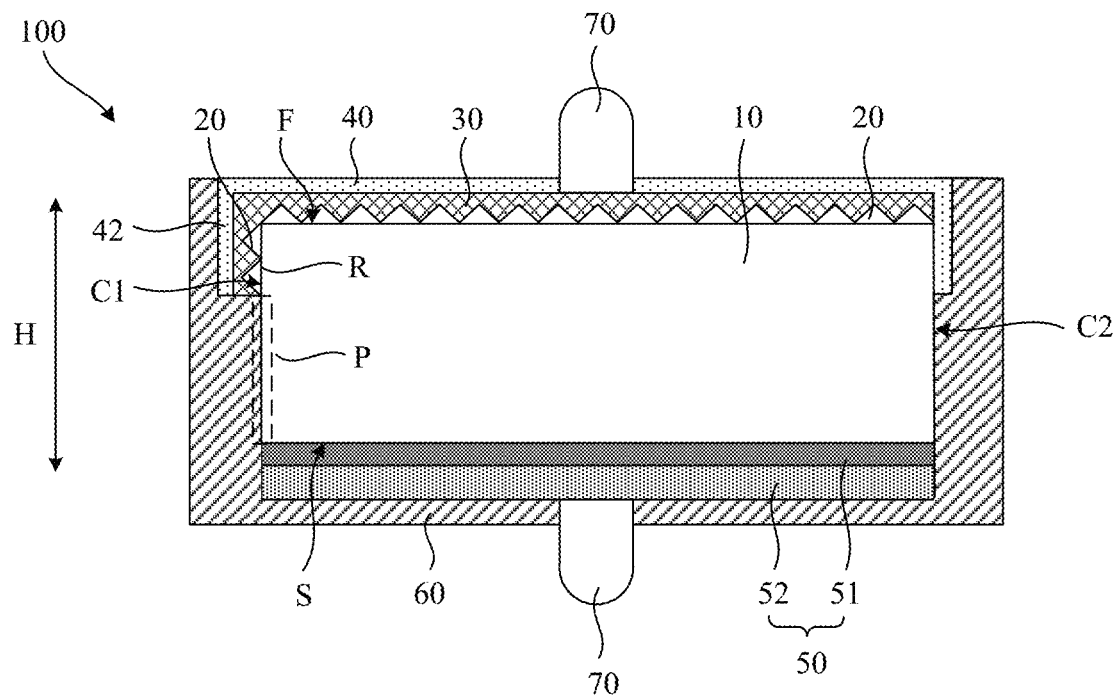
FIG. 7 is a structural schematic view of a solar cell provided in an embodiment of the present application.
Figure 8:
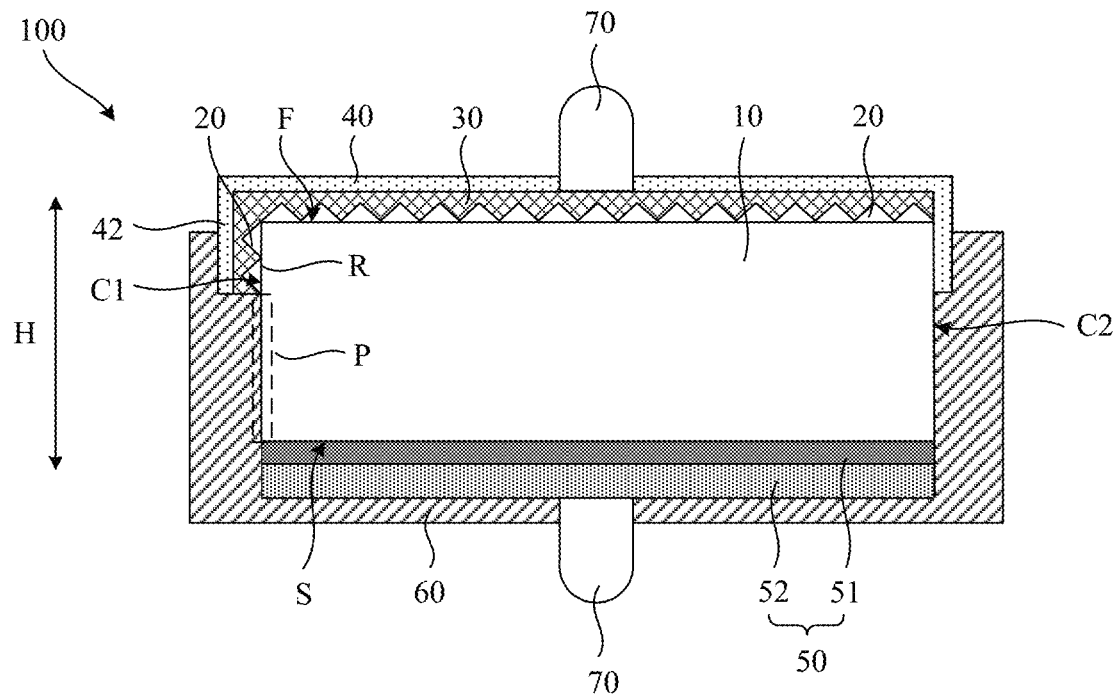
FIG. 8 is a structural schematic view of a solar cell provided in an embodiment of the present application.

FIG. 5 and FIG. 6 show embodiments that the first passivation layer 40 on the first side surface C1 extends beyond the edge of the doped conducting layer 30 along the thickness direction H of the substrate 10. FIG. 7 and FIG. 8 show embodiments that the edge of the first passivation layer 40 on the first side surface C1 is flush with the edge of the doped conducting layer 30.

FIG. 5 and FIG. 7 show embodiments that the second passivation layer 60 on the first side surface C1 extends along the thickness direction H of the substrate 10, such that the edge of the second passivation layer 60 is flush with the outer surface of the first passivation layer 40 on the first surface F. FIG. 6 and FIG. 8 show the embodiments that the second passivation layer 60 partially covers the second portion 42, which is the portion of the first passivation layer 40 located on the first side surface C1 and covering the textured structure R.

The arrangement of the films or layers on the cut edge side surface C2 is as follows.

Referring to FIGS. 5 to 8, in some embodiments, the textured structure 20 is only formed in the first surface F and a portion of the first side surface C1. The doped conducting layer 30 is only formed on the first surface F and a portion of the first side surface C1 to cover the textured structure 20. Thus, the textured structure 20 and the doped conducting layer 30 are not formed on the cut edge side surface C2.

In some embodiments, the first passivation layer 40 also covers at least a portion of the cut edge side surface C2. The cut edge side surface C2 corresponds to the cut-formed surface of the solar cell 100, so that at least a portion of the cut edge side surface C2 is protected by the first passivation layer 40, which not only increases the passivation effect on the cut edge side surface C2, but also alleviates the recombination of carriers at the cut edge side surface C2. In addition, the first passivation layer 40 is an insulating layer, which effectively prevents leakage currents at the cut edge side surface C2, thereby increasing the output power while improving the conversion efficiency of the solar cell 100.

Further, the coverage range of the first passivation layer 40 on the cut edge side surface C2 can be as follows. For example, as shown in FIG. 5, the edge of the first passivation layer 40 can be located on the cut edge side surface C2 and away from the first surface F, being flush with the surface of the passivating contact layer 50 away from the substrate 10. Alternatively, as shown in FIG. 6, FIG. 7 and FIG. 8, the edge of the first passivation layer 40 located on the cut edge side surface C2 and away from the first surface F can be located within the range of the cut edge side surface C2.

Certainly, the edge of the first passivation layer 40 on the first side surface C1 can be flush with the other edge of the first passivation layer 40 on the cut edge side surface C2. Alternatively, the edge of the first passivation layer 40 on the first side surface C1 is not flush with the other edge of the first passivation layer 40 on the cut edge side surface C2.

In some embodiments, the second passivation layer 60 also covers at least a portion of the cut edge side surface C2, so as to cover at least a portion of the first passivation layer 40 on the cut edge side surface C2.

Specifically, as shown in FIG. 5 and FIG. 7, the second passivation layer 60 on the cut edge side surface C2 extends along the thickness direction H of the substrate 10, such that the edge of the second passivation layer 60 is flush with the outer surface of the first passivation layer 40 on the first surface F. Alternatively, as shown in FIG. 6 and FIG. 8, the second passivation layer 60 only covers a portion of the first passivation layer 40 on the cut edge side surface C2.

Certainly, the edge of the second passivation layer 60 on the first side surface C1 can be flush with the other edge of the second passivation layer 60 on the cut edge side surface C2. Alternatively, the edge of the second passivation layer 60 on the first side surface C1 is not flush with the other edge of the second passivation layer 60 on the cut edge side surface C2.

Referring to FIGS. 9 to 12, in some embodiments of the present application, the solar cells 100 based on the above embodiments are further improved by forming a film or layer structure on the cut edge side surface C2. It can be understood that the film or layer structures and the coverage ranges thereof on the first surface F and the first side surface C1 of the substrate 10 are the same as those in the above embodiments, which will not be repeatedly described herein.

Figure 9:
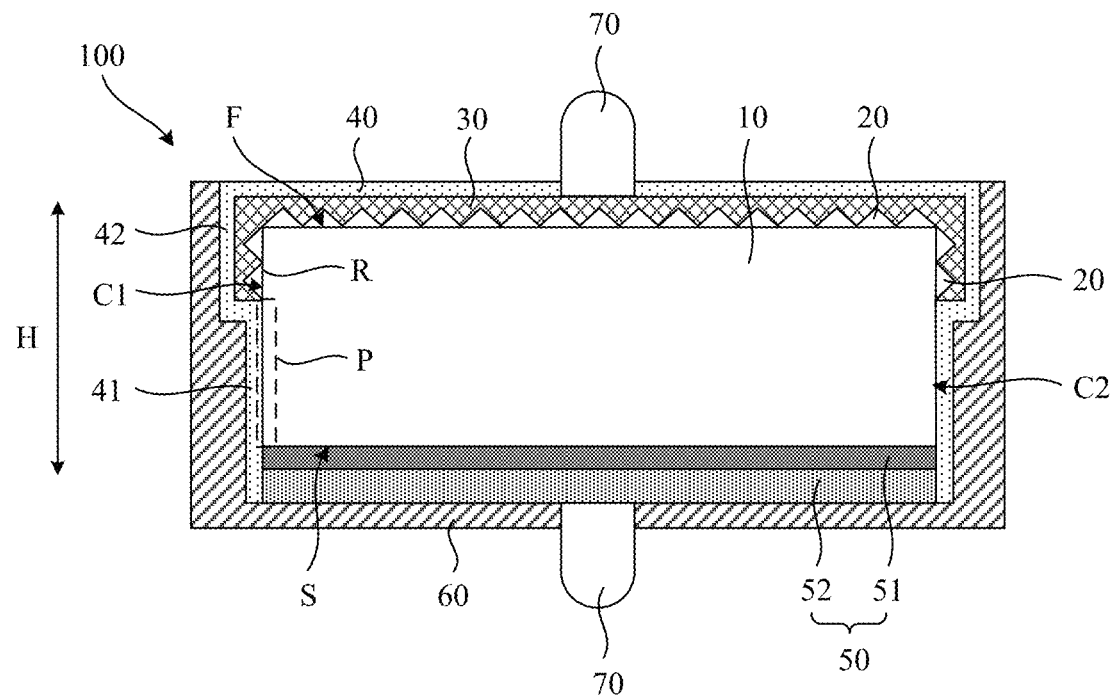
FIG. 9 is a structural schematic view of a solar cell provided in an embodiment of the present application.
Figure 10:
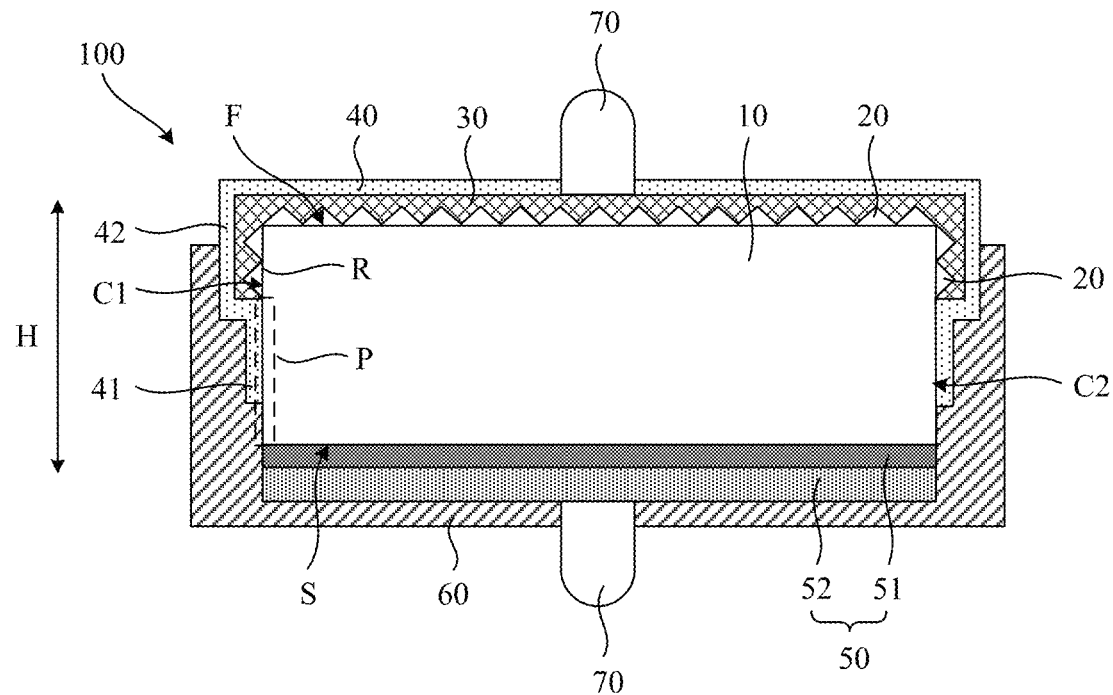
FIG. 10 is a structural schematic view of a solar cell provided in an embodiment of the present application.
Figure 11:
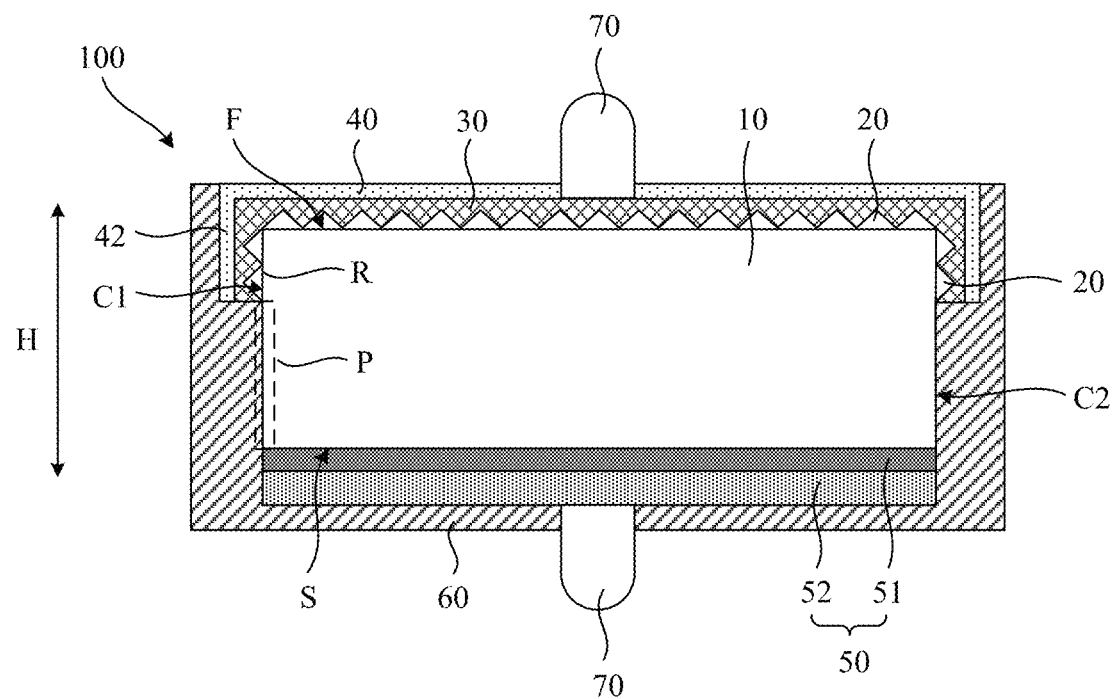
FIG. 11 is a structural schematic view of a solar cell provided in an embodiment of the present application.
Figure 12:
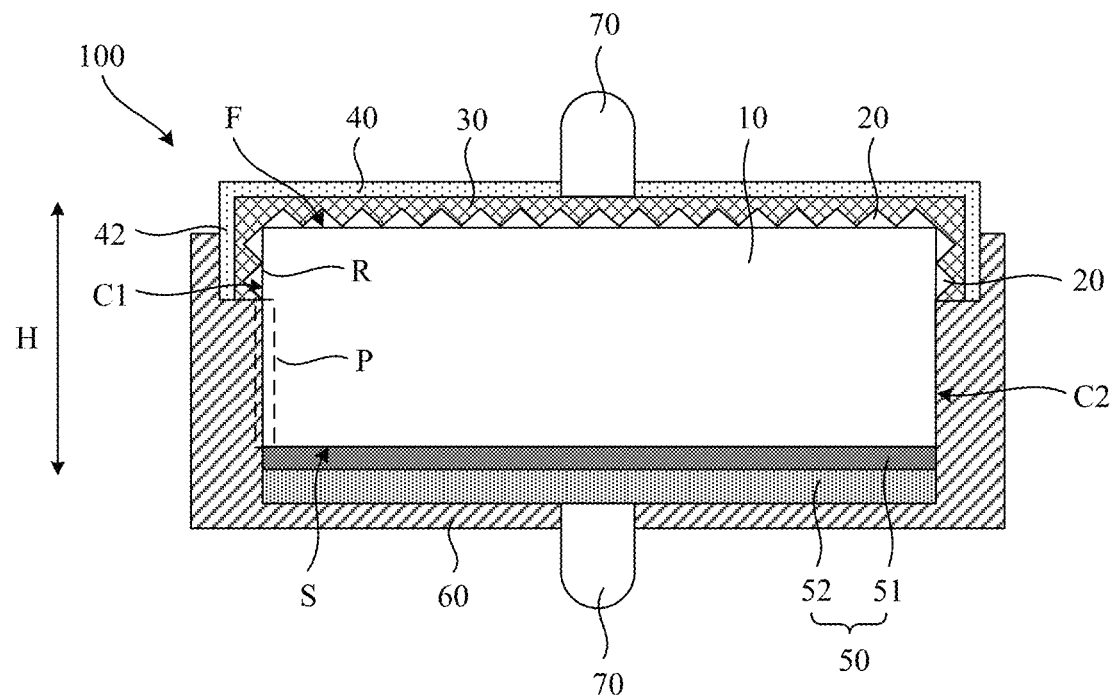
FIG. 12 is a structural schematic view of a solar cell provided in an embodiment of the present application.
Figure 13:
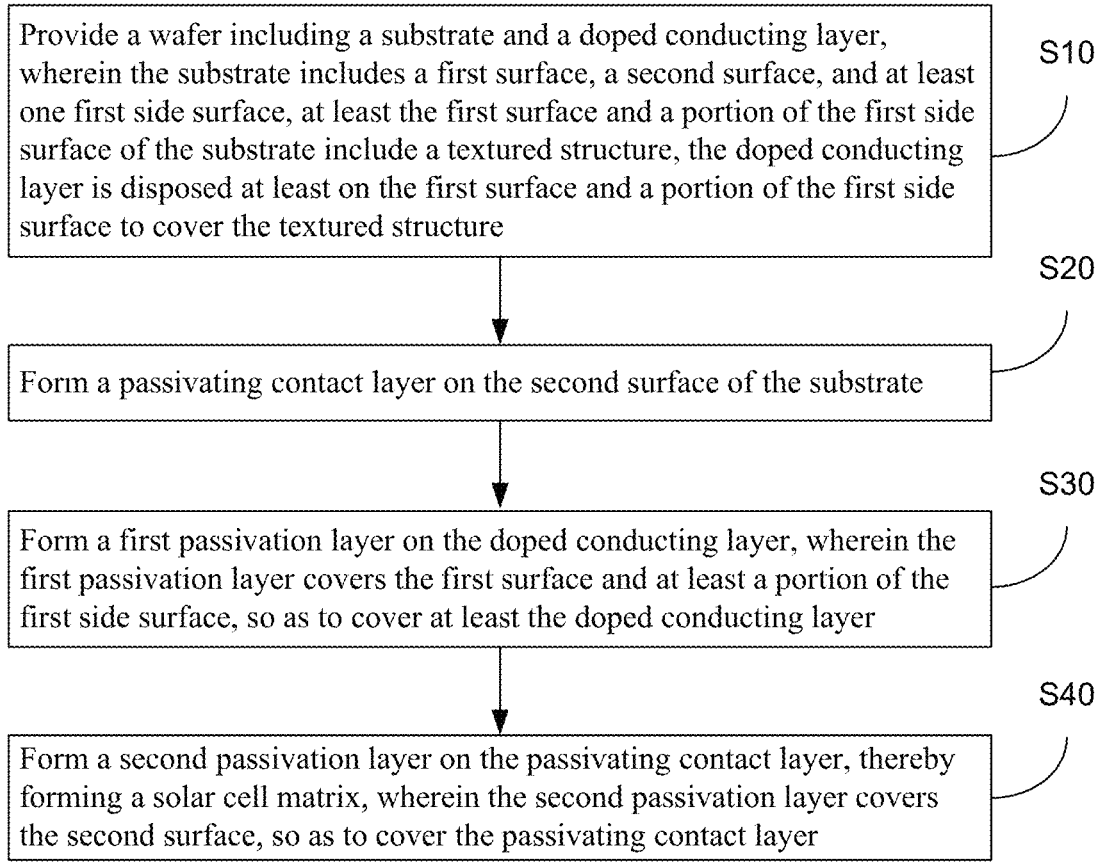
FIG. 13 is a flowchart of a method for manufacturing a solar cell provided in an embodiment of the present application.

For example, FIG. 9 and FIG. 10 show embodiments that the first passivation layer 40 on the first side surface C1 extends beyond the edge of the doped conducting layer 30 along the thickness direction H of the substrate. FIG. 11 and FIG. 12 show embodiments that the edge of the first passivation layer 40 on the first side surface C1 is flush with the edge of the doped conducting layer 30.

FIG. 9 and FIG. 11 show embodiments that the second passivation layer 60 on the first side surface C1 extends along the thickness direction H of the substrate 10, such that the edge of the second passivation layer 60 is flush with the outer surface of the first passivation layer 40 on the first surface F. FIG. 10 and FIG. 12 show embodiments that the second passivation layer 60 partially covers the second portion 42.

The arrangement of the films or layers on the cut edge side surface C2 is as follows.

Referring to FIGS. 9 to 12, in some embodiments, the textured structure 20 is also formed in at least a portion of the cut edge side surface C2. The doped conducting layer 30 is disposed on the first surface F, a portion of the first side surface C1, and a portion of the cut edge side surface C2, so as to cover the textured structure 20. The first passivation layer 40 also covers at least a portion of the cut edge side surface C2, so as to cover at least the doped conducting layer 30. In some embodiments, the doped conducting layer 30 completely covers the textured structure 20 on the cut edge side surface C2. The first passivation layer 40 completely covers the doped conducting layer 30 on the cut edge side surface C2.

In this way, on the basis of increasing the passivation effect on the first side surface C1 and alleviating the recombination of carriers at the first side surface C1, as a portion of the cut edge side surface C2 also includes the textured structure 20 and the doped conducting layer 30 is disposed on the textured structure 20, the doped conducting layer 30 on this region is conducive to reducing the recombination of carriers at interface at the cut edge side surface C2, thereby achieving a relatively good passivation effect on the cut edge side surface C2. In addition, the textured structure 20 in the cut edge side surface C2 increases the light absorption area of the solar cell 100, thereby increasing the photogenerated current of the solar cell 100, which is conducive to the efficiency of the solar cell 100.

In other embodiments, the first passivation layer 40 at least covers at least a portion of the cut edge side surface C2, so as to cover at least the doped conducting layer 30, so that at least a portion of the cut edge side surface C2 is protected by the first passivation layer 40, which not only increases the passivation effect on the cut edge side surface C2, but also alleviates the recombination of carriers at the cut edge side surface C2. In addition, the first passivation layer 40 is an insulating layer, which can effectively prevents leakage currents at the cut edge side surface C2, thereby increasing the output power while improving the conversion efficiency of the solar cell 100.

Further, the coverage range of the first passivation layer 40 on the cut edge side surface C2 can be as follows. For example, as shown in FIG. 9, the first passivation layer 40 on the cut edge side surface C2 extends along the thickness direction H of the substrate 10, such that the edge of the first passivation layer 40 away from the first surface F is flush with the surface of the passivating contact layer 50 away from the substrate 10. Alternatively, as shown in FIG. 11 and FIG. 12, on the cut edge side surface C2, the edge of the first passivation layer 40 away from the first surface F is flush with the edge of the doped conducting layer 30. Alternatively, as shown in FIG. 10, the first passivation layer 40 extends beyond the edge of the doped conducting layer 30, and the edge of the first passivation layer 40 away from the first surface F is located within the range of the cut edge side surface C2.

Certainly, the edge of the first passivation layer 40 on the first side surface C1 can be flush with the other edge of the first passivation layer 40 on the cut edge side surface C2. Alternatively, the edge of the first passivation layer 40 on the first side surface C1 is not flush with the other edge of the first passivation layer 40 on the cut edge side surface C2.

In some embodiments, the second passivation layer 60 also covers at least a portion of the cut edge side surface C2, so as to cover at least a portion of the first passivation layer 40 on the cut edge side surface C2.

Specifically, as shown in FIG. 9 and FIG. 11, the second passivation layer 60 on the cut edge side surface C2 extends along the thickness direction H of the substrate, such that the edge of the second passivation layer 60 is flush with the outer surface of the first passivation layer 40 on the first surface F. Alternatively, as shown in FIG. 10 and FIG. 12, the second passivation layer 60 only covers a portion of the first passivation layer 40 on the cut edge side surface C2.

Certainly, the edge of the second passivation layer 60 on the first side surface C1 can be flush with the other edge of the second passivation layer 60 on the cut edge side surface C2. Alternatively, the edge of the second passivation layer 60 on the first side surface C1 is not flush with the other edge of second passivation layer 60 on the cut edge side surface C2.

Only one first side surface C1 and one cut edge side surface C2 is taken as example for above description. When the substrate 10 includes a plurality of first side surfaces C1 and/or a plurality of cut edge side surfaces C2, the plurality of first side surfaces C1 and/or the plurality of cut edge side surfaces C2, as well as the films or layers thereon can respectively have same or different structures. The above embodiments can be arbitrarily combined and applied to the plurality of first side surfaces C1 and/or the plurality of cut edge side surfaces C2.

It can be understood that the doped conducting layer 30 can be formed by diffusing doping elements to at least a portion of a surface of the substrate 10. Both the first passivation layer 40 and the second passivation layer 60 can be formed by using a deposition method, such as plasma-enhanced chemical vapor deposition. Therefore, the outer surfaces of the doped conducting layer 30, the first passivation layer 40, and the second passivation layer 60 may be non-flat but have conformal structures corresponding to the surfaces of the substrate 10. When covering the textured structure 20, the doped conducting layer 30, the first passivation layer 40, and/or the second passivation layer 60 also have a textured structure. When covering a flat surface, for example, covering the flat region P, the doped conducting layer 30, the first passivation layer 40, and/or the second passivation layer 60 also have flat surfaces.

An embodiment of the present application provides a method for manufacturing a solar cell. The method is adapted to manufacture the solar cell in any of the above embodiments. The structures, functions, working principles, etc. relating to the solar cell 100 that have been described in the above embodiments may not be repeated herein.

Referring to FIGS. 13 to 18, the method for manufacturing the solar cell includes steps S10 to S40.

S10, provide a wafer 101. The wafer 101 includes a substrate 10 and a doped conducting layer 30. The substrate 10 includes a first surface F, a second surface S, and at least one first side surface C1. The first surface F and second surface S are opposite to each other. The at least one first side surface C1 is adjacent to and between the first surface F and the second surface S. At least the first surface F and a portion of the first side surface C1 of the substrate 10 include a textured structure 20. The doped conducting layer 30 is disposed at least on the first surface F and a portion of the first side surface C1 to cover the textured structure 20.

S20, form a passivating contact layer 50 on the second surface S of the substrate 10.

S30, form a first passivation layer 40 on the doped conducting layer 30. The first passivation layer 40 covers the first surface F and at least a portion of the first side surface C1, so as to cover at least the doped conducting layer 30.

S40, form a second passivation layer 60 on the passivating contact layer 50, thereby forming a solar cell matrix 103. The second passivation layer 60 covers the second surface S, so as to cover the passivating contact layer 50.

In the above embodiment, the first surface F and a portion of the first side surface C1 of the substrate 10 include a textured structure 20. The doped conducting layer 30 is at least disposed on the first surface F and at least a portion of the first side surface C1, so as to cover the textured structure 20. Since a portion of the first side surface C1 has the textured structure and the doped conducting layer 30 is disposed on the textured structure 20, the doped conducting layer 30 on the first side surface C1 is conducive to reducing recombination of carriers at interface at the first side surface C1, thereby achieving relatively good passivation effect on the first side surface C1. In addition, the textured structure 20 in the first side surface C1 increases the light absorption area of the solar cell 100, increasing the photogenerated current of the solar cell 100, which is conducive to increasing the efficiency of the solar cell 100.

On the other hand, the first passivation layer 40 is formed on the doped conducting layer 30. The first passivation layer 40 covers at least the first surface F and at least a portion of the first side surface C1, so as to cover at least the doped conducting layer 30. Thus, at least a portion of the first side surface C1 is protected by the first passivation layer 40, which not only increases the passivation effect on the first side surface C1, but also alleviates the recombination of carriers at the first side surface C1. In addition, the first passivation layer 40 is an insulating layer, which effectively prevents leakage currents at the first side surface C1, thereby increasing the output power and the conversion efficiency of the solar cell 100.

It can be understood that the structures, materials, and coverage ranges of the texture structure 20, the doped conducting layer 30, the first passivation layer 40, the passivating contact layer 50, and the second passivation layer 60 have been described in detail in the above embodiments and will not be repeatedly described herein.

Figure 16A:
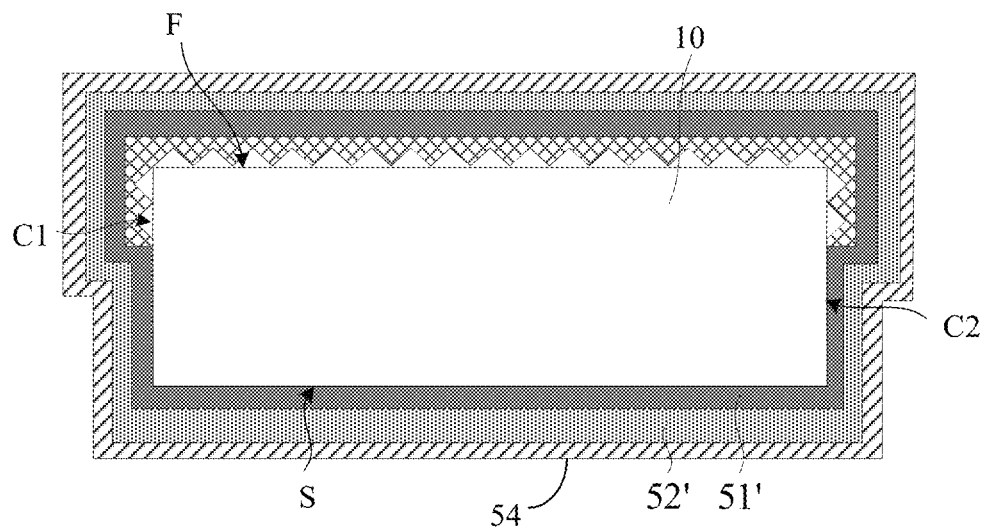
FIG. 16A and FIG. 16B are structural schematic views of a passivating contact layer formed in the method for manufacturing a solar cell according to an embodiment of the present application.
Figure 16B:
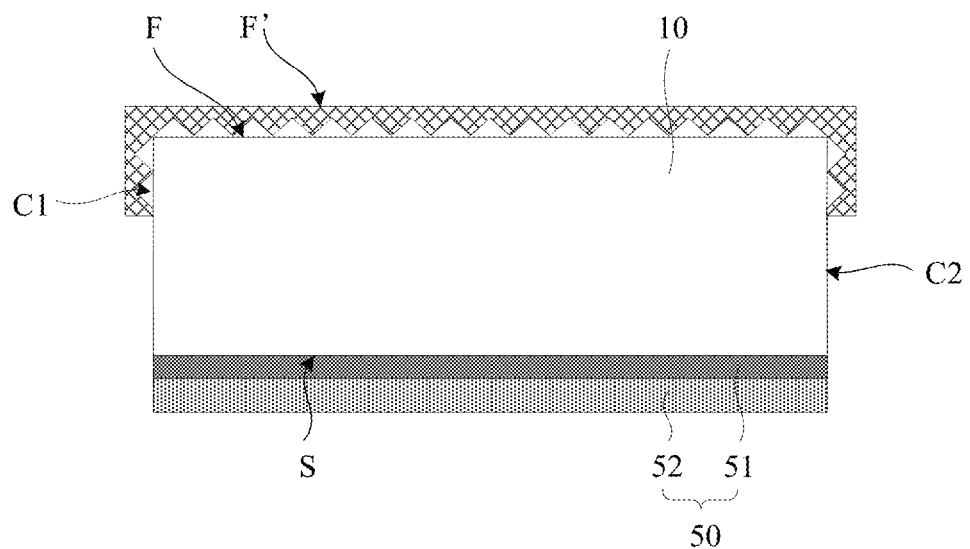

In some embodiments, referring to FIGS. 16A and 16B, in step S20, the step of forming the passivating contact layer 50 on the second surface S of the substrate 10 includes steps of:
sequentially forming a tunnel material layer 51', a doped polysilicon material layer 52', and an oxide material layer 54 on each surface of the wafer 101;
etching to remove the oxide material layer 54 on a surface F' of a first side of the wafer 101 and on each side surface of the wafer 101; and
etching to remove the doped polysilicon material layer 52' and the tunnel material layer 51' on the surface F' of the first side of the wafer 101 and on each side surface of the wafer 101;
wherein the surface F' of the first side of the wafer corresponds to the first surface F of the substrate 10.

In this way, only the tunnel material layer, the doped polysilicon material layer, and the oxide material layer on the second surface S remain. The tunnel material layer remained on the second surface S is the tunnel oxide layer 51. The doped polysilicon material layer remained on the second surface S is the doped polysilicon conducting layer 52. The oxide material layer, for example, a silicon oxide layer, can function as a mask in a subsequent manufacture process, and can be removed by a subsequent process such as etching. In this way, the passivating contact layer 50 can be formed on the second surface S.

Exemplarily, the oxide material layers is etched and thus removed by using a continuous-type machine; the tunnel material layer and the doped polysilicon material layer are etched and thus removed by using a through-type machine.

Figure 19:
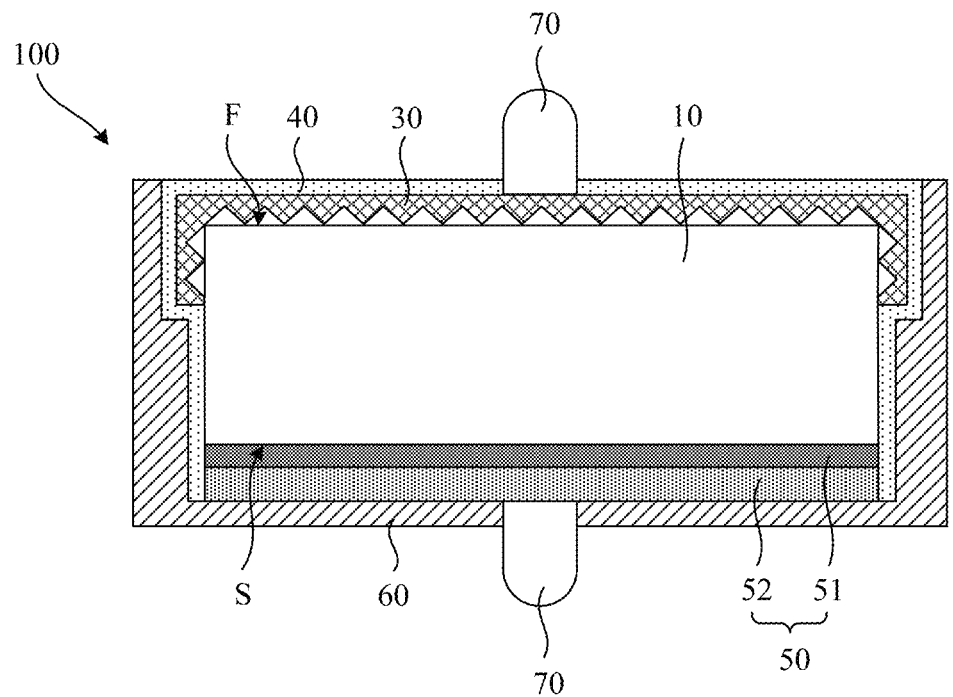
FIG. 19 is a schematic view of a solar cell formed in the method for manufacturing a solar cell according to an embodiment of the present application.

Referring to FIG. 19, in some embodiments, in step S40, after the step of forming the second passivation layer 60 on the passivating contact layer 50, the method further includes a step of respectively forming electrodes 70 on the first passivation layer 40 and the second passivation layer 60. The electrode 70 at the first surface F side of the substrate 10 penetrates the first passivation layer 40 and is electrically connected to the doped conducting layer 30. The electrode 70 at the second surface S side of the substrate 10 penetrates the second passivation layer 60 and is electrically connected to the passivating contact layer 50.

It can be understood that, in order to improve the photoelectric conversion efficiency, the cell with a standard size can be cut into halves or cut into multiple parts, which can be then connected in series to form a module.

In different embodiments of the method for manufacturing a solar cell of the present application, the cutting step can be performed at different stages.

For example, the cutting step can be performed in step S10. Alternatively, the cutting step can be performed after step S40. Alternatively, the cutting step can be performed between steps S10 and S40.

In the embodiment that the cutting step is performed in step S10, for example, the cutting step is specifically referred to cutting a substrate blank into substrates 10 with sizes as required by solar cells 100.

In some embodiments, before doping and texturing, the substrate blank can be cut into substrates 10 with suitable sizes corresponding to the sizes of the actual required solar cells 100. By performing the cutting step in advance followed by the subsequent single-side etching process and the interface passivation process, the edge surfaces of the solar cell 100, including the cut edge side surface C2, can be effectively passivated, thereby reducing recombination of carriers, and improving photoelectric conversion efficiency. Moreover, no cutting step is performed in the subsequent steps, avoiding forming new cut surfaces, which effectively avoids significant carrier recombination occurring at the cut-formed surface in the related art.

Figure 14:
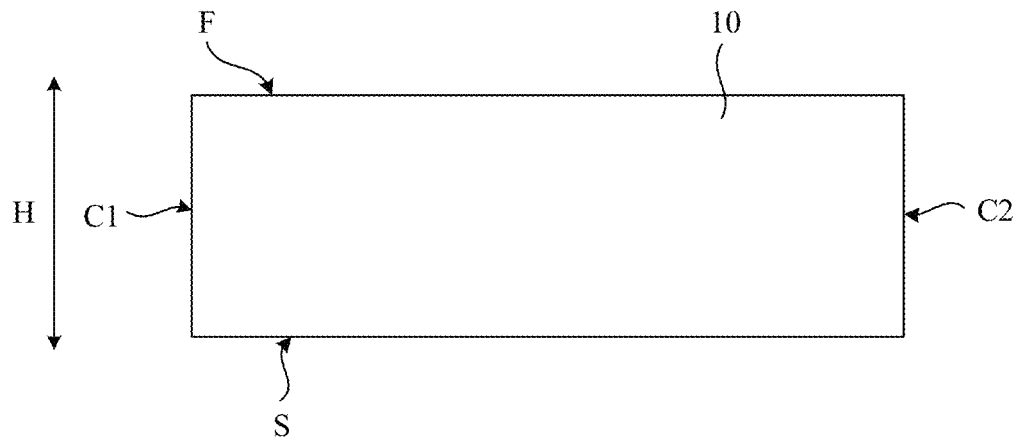
FIG. 14 is a structural schematic view of a substrate in the method for manufacturing a solar cell provided in an embodiment of the present application.
Figure 15:
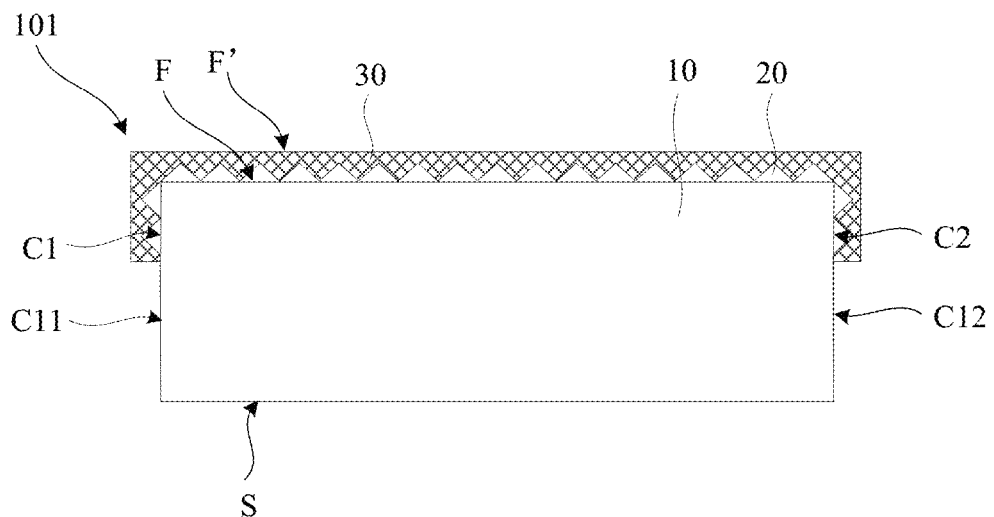
FIG. 15 is a structural schematic view of a textured structure and a doped conducting layer formed on a substrate in the method for manufacturing a solar cell provided in an embodiment of the present application.

Specifically, referring to FIG. 14 and FIG. 15, in step S10, the step of providing the wafer 101 includes:
cutting a substrate blank along the thickness direction to form the substrates 10, wherein the cut edge side surface C2 of each substrate 10 is formed by the cutting step;
performing texturing treatment and diffusion of dopant elements to at least the first surface F, each first side surface C1, and each cut edge side surface C2 of each substrate 10; and
etching each substrate 10 to expose the second surface S, a first target region C11 of each first side surface C1, and a second target region C12 of each cut edge side surface C2 of the substrate 10, so as to form the textured structure 20 and the doped conducting layer 30 covering the textured structure 20 on the first surface F, a portion of each first side surface C1, and a portion of each cut edge side surface C2 of each substrate 10;
wherein the first target region C11 is a region of the first side surface C1 adjacent to the second surface S, and the second target region C12 is a region of the cut edge side surface C2 adjacent to the second surface S.

In the above steps, in the texturing treatment, all surfaces of the substrate 10 can be textured and formed into textured surfaces. In the diffusion of dopant elements to the substrate 10, the first surface F of the substrate 10 can be doped with the dopant elements to form the doped conducting layer 30, and some of the dopant elements wrap around the substrate 10 and deposit on the first side surface C1, the cut edge side surface C2, and the second surface S of the substrate 10, so that the first side surface C1, the cut edge side surface C2 and the second surface S are also covered with the doped conducting material. In the etching step, the first side surface C1, the cut edge side surface C2, and the second surface S of the substrate 10 can be etched by using a single-side etching technique, so as to remove the doped conducting material and the textured structure from the second surface S, the first target region C11 of the first side surface C1, and the second target region C12 of the cut edge side surface C2 of the substrate 10, thereby exposing the second surface S, the first target region C11 of the first side surface C1, and the second target region C12 of the cut edge side surface C2 of the substrate 10 to avoid leakage. As a result, the textured structure 20 and the doped conducting layer 30 located on the first surface F, a portion of the first side surface C1, and a portion of the cut edge side surface C2 are remained and thus formed.

Specifically, the step of etching the substrate 10 to expose the second surface S, the first target region C11 of each first side surface C1, and the second target region C12 of each cut edge side surface C2 of the substrate 10 includes step D and step E.

Figure 20:
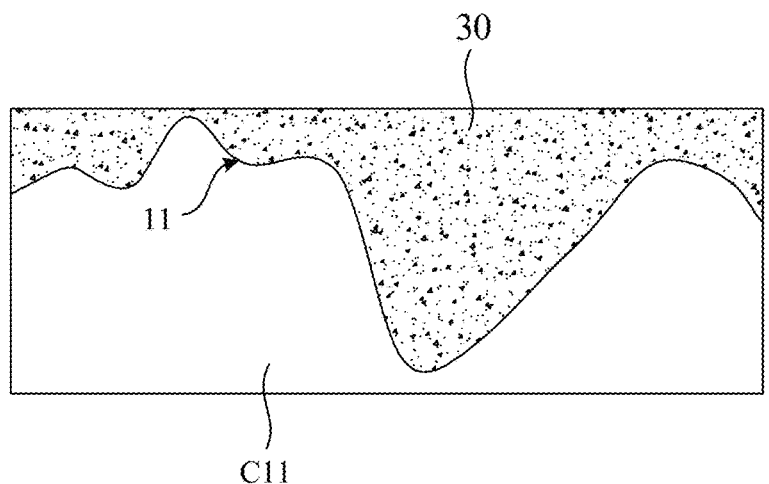
FIG. 20 is a structural schematic view of a first side surface of a substrate in the method for manufacturing a solar cell according to an embodiment of the present application.

Step D: Etch the substrate 10 subjected to the texturing treatment and diffusion of dopant elements, so as to expose the textured structure in the second surface S, the first target region C11 of each first side surface C1, and the second target region C12 of each cut edge side surface C2. In some embodiments, the etching can be performed by using a continuous-type machine. During the etching process, the liquid level in the continuous-type machine needs to be controlled to avoid the etching solution being in contact with the textured structure 20 and the doped conducting layer 30 on the first surface F of the substrate 10. In an embodiment, after the etching step, the morphology on the first side surface C1 is irregular as shown in FIG. 20.

Step E: Etch to remove the exposed textured structure in the second surface S, the first target region C11, and the second target region C12, so as to expose the second surface S, the first target region C11 of each first side surface C1, and the second target region C12 of each cut edge side surface C2 of the substrate 10. In some embodiments, the etching can be performed by using a through-type machine. It can be understood that etching to remove the exposed textured structure is to polish the exposed textured structure, so as to form a non-textured structure, such as a relatively flat surface. Due to the slight fluctuations of the surface of the etching solution and the soaking of the substrate 10 with the etching solution during the etching process, as shown in FIG. 20, the boundary line 11 between the doped conducting layer 30 and the first target region C11 may be not a straight line, but exhibits an irregular wavy pattern.

In some embodiments, the step of cutting the substrate blank along the thickness direction to form the substrates 10 includes a step of laser cutting the substrate blank along the thickness direction H to form the substrates 10. In some embodiments, the substrate blank can be divided into two substrates 10 by one laser cutting step.

A specific example is given below to illustrate the method for manufacturing the solar cell which performs the cutting step in step S10. This example will be compared with a comparative example.

Example 1: A Method for Manufacturing a Solar Cell Includes Steps SJ to SO

Step SJ: Referring to FIG. 14, a substrate blank is cut along the thickness direction H to form at least two substrates 10. Each substrate 10 includes a first surface F and a second surface S opposite to each other, and includes a plurality of first side surfaces C1 adjacent to and between the first surface F and the second surface S, and further includes at least one cut edge side surface C2 formed by a cutting step.

Step SK: Referring to FIG. 15, surfaces of the substrate 10 are textured and diffused with boron elements. The substrate 10 is then etched to expose the second surface S, the first target region C11 of each first side surface C1, and the second target region C12 of each cut edge side surface C2 of the substrate 10, so as to remain the textured structure 20 in the first surface F, a portion of each first side surface C1, and a portion of each cut edge side surface C2 of the substrate 10, and remain a doped conducting layer 30 (i.e., the boron-doped conducting layer) covering the textured structure 20 of the first surface F, a portion of each first side surface C1, and a portion of each cut edge side surface C2 of the substrate 10, thereby forming a wafer 101.

Step SL: A tunnel material layer, a doped polysilicon material layer, and an oxide material layer are sequentially stacked on surfaces of the wafer 101. The oxide material layer on the surface F' of the first side of the wafer 101 and on the side surfaces of the wafer 101 (including every first side surface C1 and every cut edge side surface C2) are etched thereby being removed. The doped polysilicon material layer and the tunnel material layer on the surface F' of the first side of the wafer 101 and on the side surfaces of the wafer 101 are etched thereby being removed. The surface F' of the first side of the wafer 10 corresponds to the first surface F of the substrate 10. In this way, only the tunnel material layer, the doped polysilicon material layer, and the oxide material layer on the second surface S remain. The tunnel material layer, for example, a silicon oxide layer, can function as a mask in a subsequent manufacture process, and can be removed by a subsequent process such as etching. In this way, a passivating contact layer 50 can be formed on the second surface S, as shown in FIG. 16.

Figure 17:
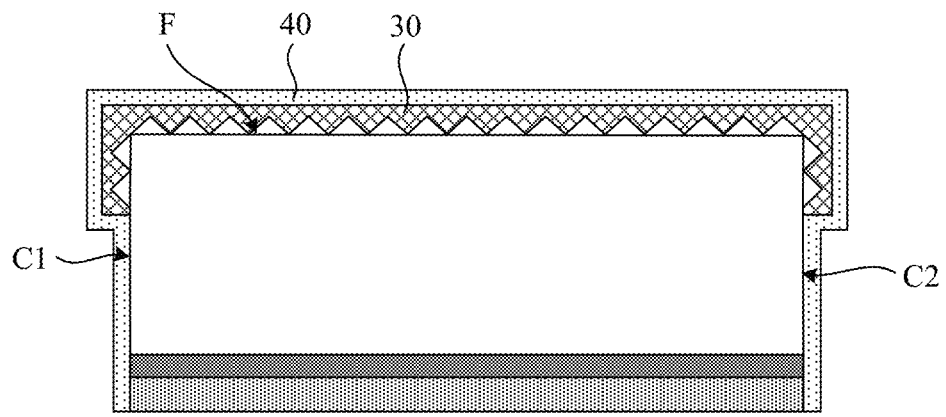
FIG. 17 is a schematic view of a first passivation layer formed in the method for manufacturing a solar cell according to an embodiment of the present application.

Step SM: Referring to FIG. 17, a first passivation layer 40 is formed on the doped conducting layer 30. The first passivation layer 40 at least covers the first surface F, at least a portion of each first side surface C1, and at least a portion of each cut edge side surface C2, so as to at least cover the doped conducting layer 30.

Figure 18:
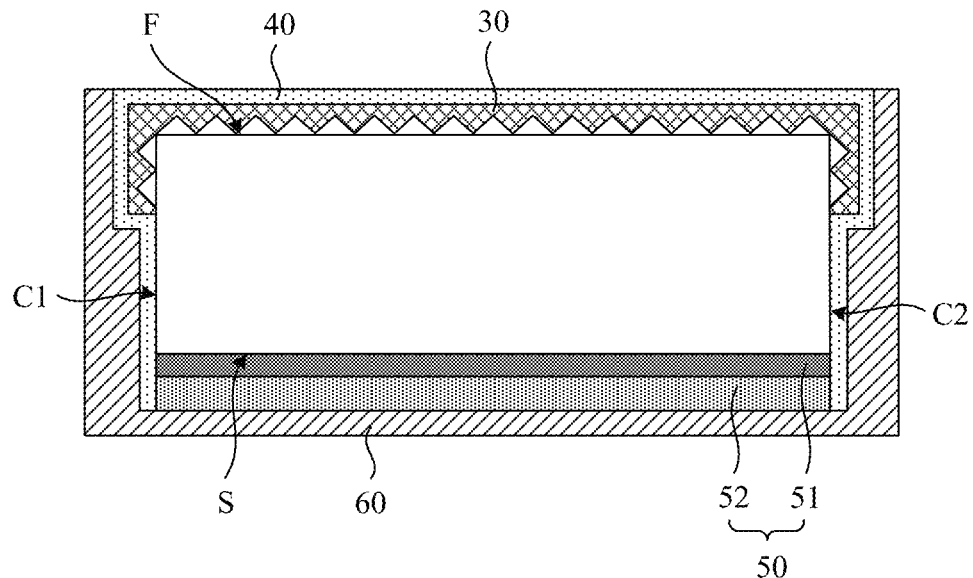
FIG. 18 is a schematic view of a second passivation layer formed in the method for manufacturing a solar cell according to an embodiment of the present application.

Step SN: Referring to FIG. 18, a second passivation layer 60 is formed on the passivating contact layer 50. The second passivation layer 60 at least covers the second surface S, at least a portion of each first side surface C1, and at least a portion of each cut edge side surface C2, so as to cover the passivating contact layer 50 and at least a portion of the first passivation layer 40.

Step SO: Referring to FIG. 19, electrodes 70 are respectively formed on the first passivation layer 40 and the second passivation layer 60, thereby achieving a solar cell 100.

The solar cell 100 manufactured through steps SJ to SO will be referred to as solar cell A1.

Comparative Example 1: A Method for Manufacturing a Solar Cell Includes Steps SP to SU Step SP: A silicon substrate is washed and textured, and then the washed and textured front surface of the silicon substrate is diffused with boron elements.

Step SQ: The borosilicate glass (BSG), formed on the back surface and the side surfaces of the silicon substrate due to wraparound deposition of boron, is removed, and the side surfaces and the back surface of the silicon substrate are polished with alkali.

Step SR: A tunnel oxide layer and a doped polysilicon conducting layer are stacked on the back surface of the silicon substrate.

Step SS: A passivation and anti-reflection film is deposited on both the front surface and the back surface of the silicon substrate.

Step ST: Electrodes are respectively formed on both the front surface and the back surface of the silicon substrate to achieve a solar cell.

Step S U: The solar cell is cut in half by a laser.

The solar cell manufactured through the steps SP to ST of the comparative example will be referred to as solar cell B1. The solar cell manufactured through the steps SP to SU of the comparative example will be referred to as solar cell B2.

The solar cell A1 and the solar cells B1 and B2 were subjected to performance tests. The test results were recorded in Table 1, wherein Uoc represents the open circuit voltage, FF represents the fill factor, Eta represents the conversion efficiency, Isc represents the short-circuit current, and IRev2 represents the reverse current.

TABLE 1

| Test results of performance of solar cells | | | | | |
|---|---|---|---|---|---|
| Solar cell | Isc (A) | Uoc (mV) | FF (%) | Eta (%) | IRev2 (A) |
| A1 | 7.79 | 712.9 | 82.95 | 24.13 | 0.05 |
| B1 | 15.56 | 713.3 | 82.98 | 24.12 | 0.08 |
| B2 | 7.76 | 712.2 | 82.21 | 23.80 | 0.09 |

From the above experimental results, it can be seen that the efficiency of the solar cell A1 (being cut) prepared by the method in Example 1 is substantially the same as the efficiency of the intact solar cell B1 (uncut) in Comparative Example 1. However, as compared with the solar cell B2 that was cut in the Comparative Example 2, the open circuit voltage of the solar cell A1 increased by 0.7 mV, the fill factor of the solar cell A1 increased by about 0.74%, the conversion efficiency of the solar cell A1 increased by about 0.33%, and the reverse current of the solar cell A1 decreased from 0.09 A to 0.05. It can be seen that the solar cell A1 prepared by the method in Example 1 has a higher efficiency.

In the above embodiments, the cutting step is performed in step S10. In some other embodiments, the cutting step can be performed after step S40. For example, the cutting step is performed after the preparation of the films and layers.

Figure 25:
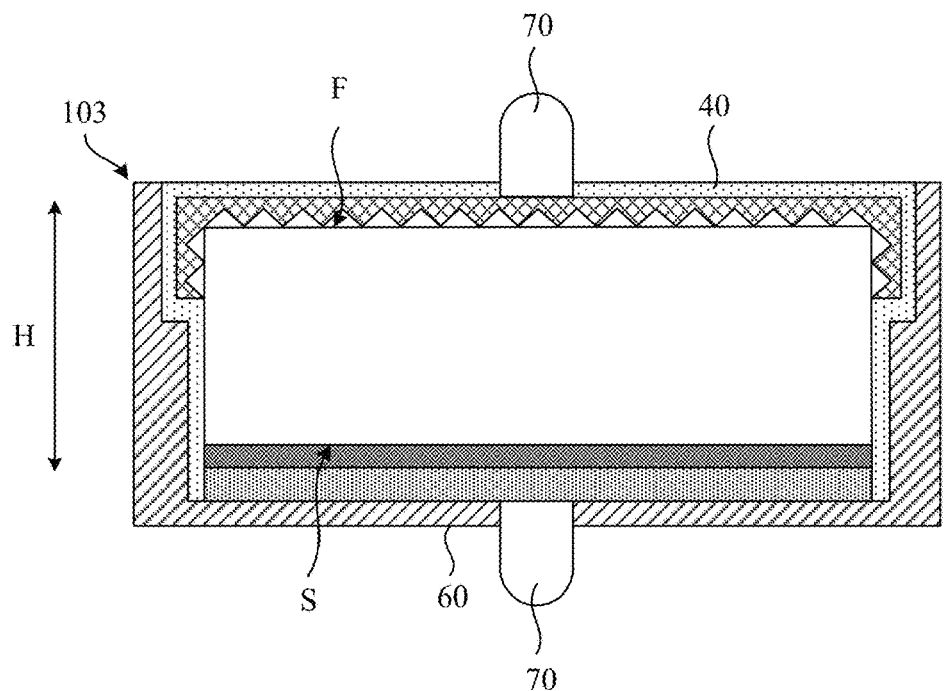
FIG. 25 is a schematic view of electrodes formed on a first passivation layer and a second passivation layer in the other method for manufacturing a solar cell provided in an embodiment of the present application.

In the embodiment that the cutting step is performed after step S40, after step S40 of forming the second passivation layer 60 on the passivating contact layer 50, the method further includes step S50:

Step S50: laser cut the solar cell matrix 103 (e.g., as shown in FIG. 25) along the thickness direction to form the cut edge side surface C2 of the substrate 10.

Figure 26:
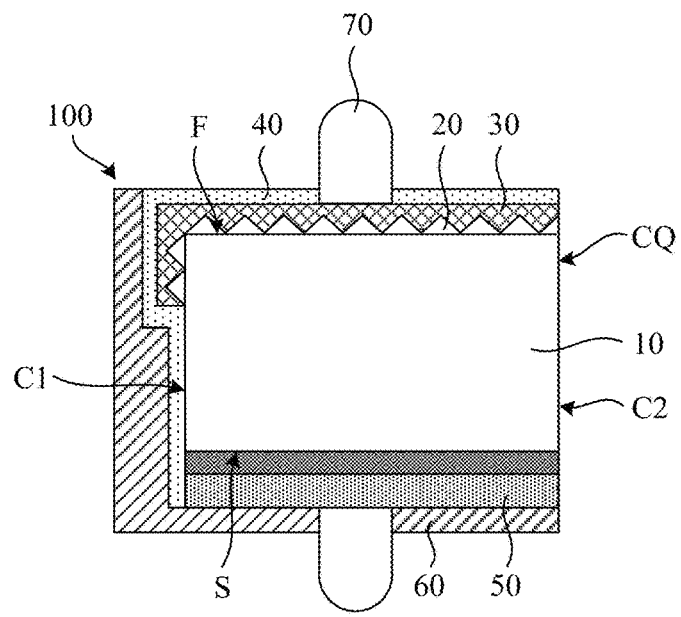
FIG. 26 is a structural schematic view of a solar cell formed in the other method for manufacturing a solar cell provided in an embodiment of the present application.

The solar cell matrix 103 can be divided into two or more solar cells 100 by the cutting step. For example, the solar cell matrix 103 can be cut into halves along the thickness direction H to form two solar cells 100 (e.g., as shown in FIG. 26).

In some embodiments, the step of forming the electrodes 70 on the first passivation layer 40 and the second passivation layer 60 can be performed before step S50.

In step S10, the substrate 10 is not formed from cutting the substrate blank and thus only includes the first side surfaces C1, not including any cut edge side surface C2. In this embodiment, in step S10, the step of providing the wafer 101 includes:

performing texturing treatment and diffusion of dopant elements to at least the first surface F and the first side surfaces C1 of the substrate 10; and etching the substrate 10 to expose the second surface S of the substrate 10 and the first target region C11 of each first side surface C1 of the substrate 10;

wherein the first target region C11 is a region of each first side surface C1 adjacent to and connected to the second surface S.

In the above steps, in the texturing treatment, all surfaces of the substrate 100 can be textured and formed into textured surfaces. In the diffusion of dopant elements to the substrate 10, the first surface F of the substrate 10 can be doped with the dopant elements to form the doped conducting layer 30, and some of the dopant elements wrap around the substrate 10 and deposit to the first side surface C1 and the second surface S of the substrate 10, so that the first side surface C1 and the second surface S are also covered with the doped conducting material. In the etching step, the first side surface C1 and the second surface S of the substrate 10 can be etched by using a single-side etching technique, so as to remove the doped conducting material and the textured structure from the second surface S and the first target region C11 of the first side surface C1 of the substrate 10, thereby exposing the second surface S and the first target region C11 of the first side surface C1 of the substrate 10 to avoid leakage. As a result, the textured structure 20 and the doped conducting layer 30 located on the first surface F and a portion of the first side surface C1 are remained and thus formed.

Specifically, the step of etching the substrate 10 to expose the second surface S and the first target region C11 of each first side surface C1 of the substrate 10 includes step D' and step E'.

Step D': Etch the substrate 10 subjected to the texturing treatment and diffusion of dopant elements, so as to expose the textured structures in the second surface S and each first target region C11. In some embodiments, the etching can be performed using a continuous-type machine. During the etching process, the liquid level in the continuous-type machine needs to be controlled to avoid the etching solution being in contact with the textured structure 20 and the doped conducting layer 30 on the first surface F of the substrate 10. In an embodiment, after the etching step, the morphology on the first side surface C1 is irregular as shown in FIG. 20.

Step E': Etch to remove the exposed textured structure, so as to expose the second surface S and the first target region C11 of each first side surface C1 of the substrate 10. In some embodiments, the etching can be performed by using a through-type machine. It can be understood that etching to remove the exposed textured structure of the surface of the substrate 10 is to polish the textured structure 20 of the first target region C11 and the second surface S of the substrate 10, so as to form a non-textured structure, such as a relatively flat surface. Due to the slight fluctuations of the surface of the etching solution and the soaking of the substrate 10 with the etching solution during the etching process, as shown in FIG. 20, the boundary line 11 between the doped conducting layer 30 and the first target region C11 may not be a straight line, but exhibits an irregular wavy pattern.

In this embodiment, since the solar cell 100 is formed by cutting the solar cell matrix 103 in step S40, the size of the finally formed solar cell 100 (e.g., as shown in FIG. 26) is smaller than the size of the solar cell matrix 103 (e.g., as shown in FIG. 25).

Figure 27:
FIG. 27 is a photograph of a cut surface of a solar cell in the other method for manufacturing a solar cell provided in an embodiment of the present application.
Figure 28:
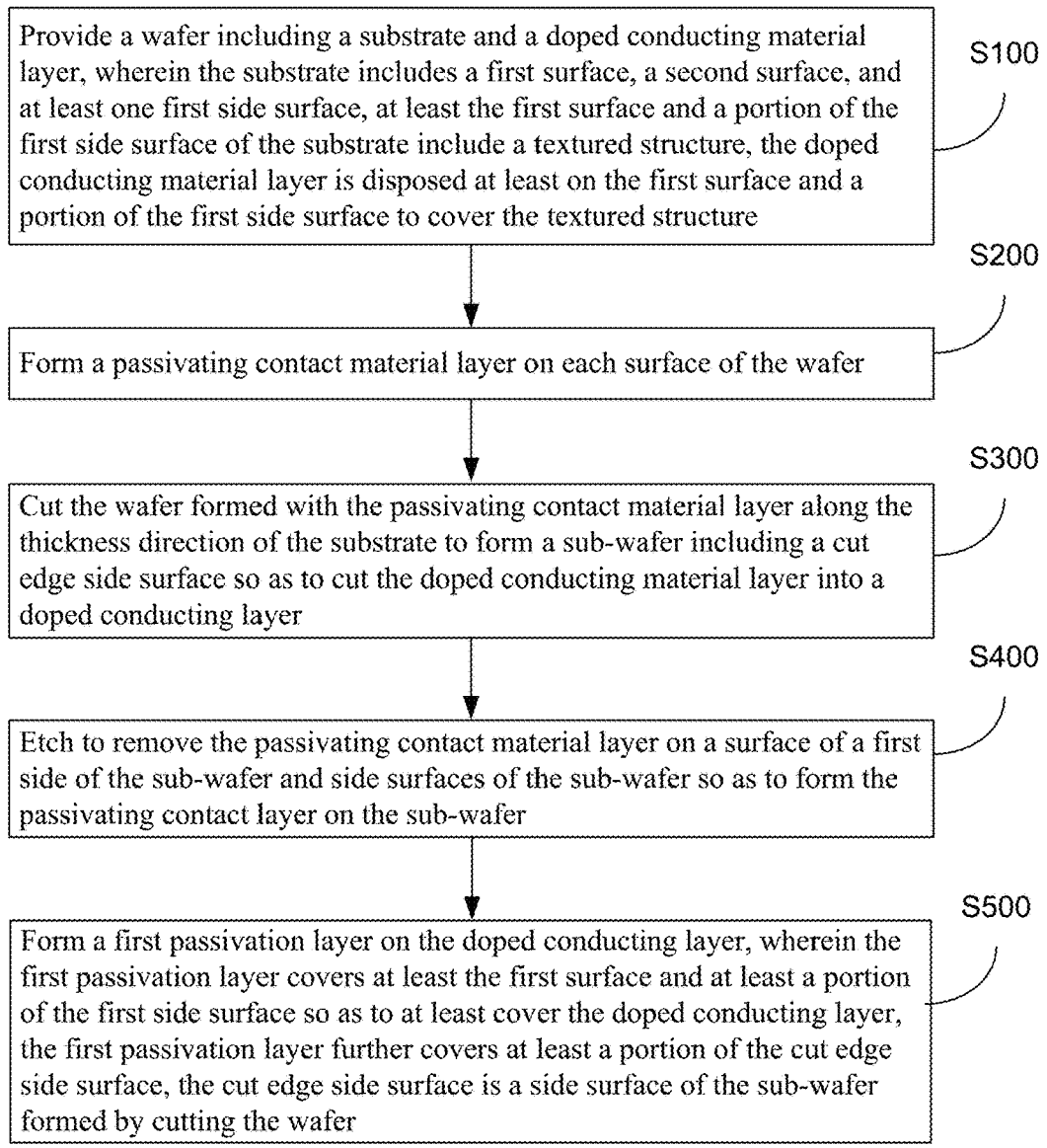
FIG. 28 is a flowchart of a method for manufacturing a solar cell provided in an embodiment of the present application.

It can be understood that by cutting the solar cell matrix 103, a cut surface CQ formed by the cutting is formed, e.g., as shown in FIG. 27.

A specific example is given below to illustrate the method for manufacturing the solar cell which performs the cutting step after step S40. This example will be compared with a comparative example.

Example 2: A Method of Manufacturing a Solar Cell Including Steps SJ' to SO'

Figure 21:
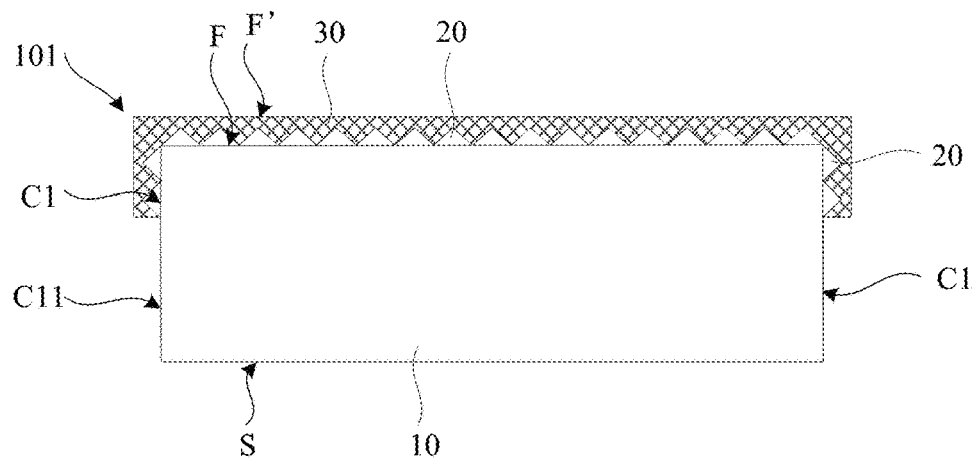
FIG. 21 is a structural schematic view of a wafer in another method for manufacturing a solar cell provided in an embodiment of the present application.

Step SJ': Referring to FIG. 21, surfaces of a substrate 10 are textured and diffused with boron elements. The substrate 10 is then etched to expose the second surface S and the first target region C11 of each first side surface C1, so as to remain the textured structure 20 in the first surface F and a portion of each first side surface C1 of the substrate 10, and remain a doped conducting layer 30 (i.e., the boron-doped conducting layer) covering the textured structure 20 of the first surface F and a portion of the first side surface C1, thereby forming a wafer 101.

Figure 22:
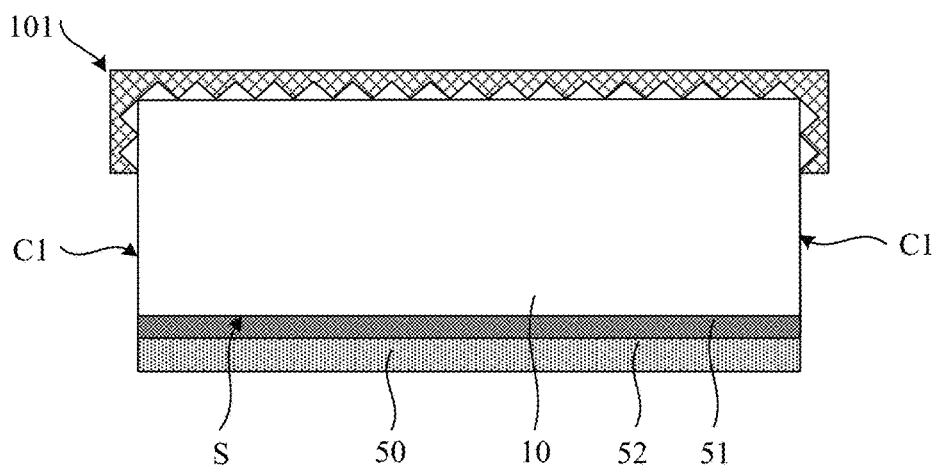
FIG. 22 is a schematic view of a passivating contact layer formed on a wafer in the other method for manufacturing a solar cell provided in an embodiment of the present application.

Step SK': Referring to FIG. 22, a tunnel material layer, a doped polysilicon material layer, and a silicon oxide material layer are sequentially stacked on surfaces of the wafer 101. The silicon oxide material layer on the surface F' of the first side of the wafer 101 and on the side surfaces of the wafer 101 are etched thereby being removed. The tunnel material layer and the doped polysilicon material layer on the surface F' of the first side of the wafer 101 and on the side surfaces of the wafer 101 are etched thereby being removed. Thus, only the tunnel material layer, the doped polysilicon material layer, and the oxide material layer on the second surface S remain. The silicon oxide material layer, for example, a silicon oxide layer, can function as a mask in a subsequent manufacture process, and can be removed by a subsequent process such as etching. In this way, a passivating contact layer 50 can be formed on the second surface S, as shown in FIG. 22.

Figure 23:
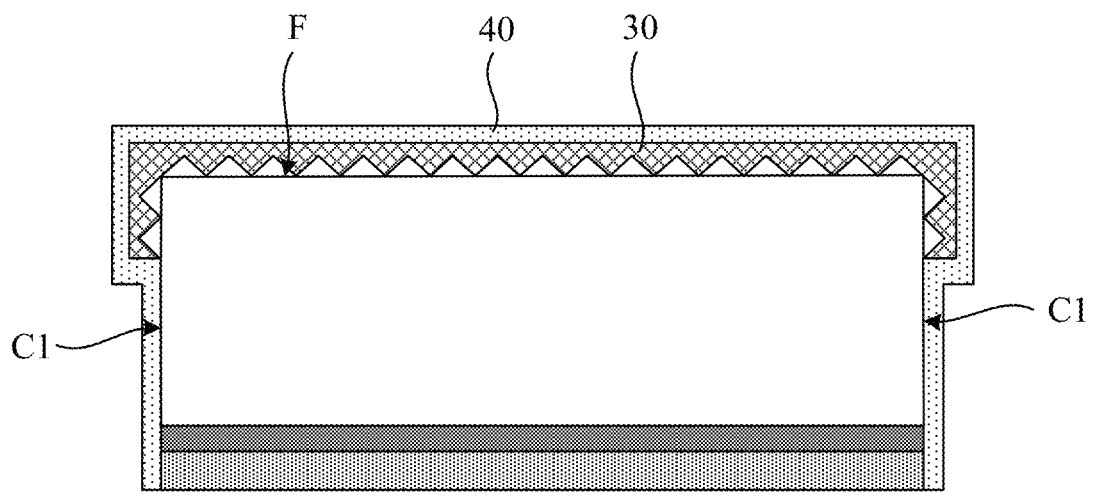
FIG. 23 is a schematic view of a first passivation layer formed on a doped conducting layer in the other method for manufacturing a solar cell provided in an embodiment of the present application.

Step SL': Referring to FIG. 23, a first passivation layer 40 is formed on the doped conducting layer 30. The first passivation layer 40 at least covers the first surface F and entire of each first side surface C1, so as to cover the doped conducting layer 30.

Figure 24:
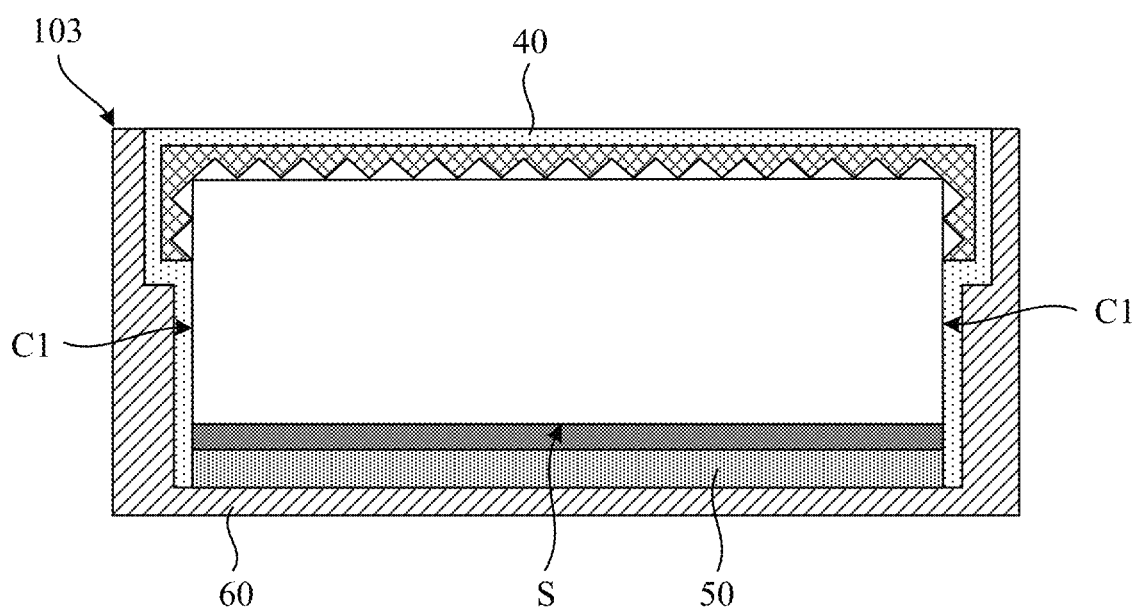
FIG. 24 is a schematic view of a second passivation layer formed on the passivating contact layer in the other method for manufacturing a solar cell provided in an embodiment of the present application.

Step SM': Referring to FIG. 24, a second passivation layer 60 is formed on the passivating contact layer 50 to form a solar cell matrix 103. The second passivation layer 60 covers the second surface S and the entire of each first side surface C1, so as to cover the passivating contact layer 50 and completely cover the first passivation layer 40 disposed on the first side surface C1.

Step SN': Referring to FIG. 25, electrodes 70 are respectively formed on the first passivation layer 40 and the second passivation layer 60 of the solar cell matrix 103.

Step SO': Referring to FIG. 26, the solar cell matrix 103 is cut by a laser along the thickness direction H, so as to form at least two solar cells 100. The solar cell 100 manufactured through steps SJ' to SO' will be referred to as solar cell A2.

The solar cell A2 and the solar cell B1 were subjected to performance tests. The test results were recorded in Table 2, wherein Uoc represents the open circuit voltage, FF represents the fill factor, Eta represents the conversion efficiency, Isc represents the short-circuit current, and IRev2 represents the reverse current.

TABLE 2

Test results of performance of solar cells

| Solar cell | Isc (A) | Uoc (mV) | FF (%) | Eta (%) | IRev2 (A) |
|---|---|---|---|---|---|
| A2 | 15.57 | 714.4 | 83.00 | 24.18 | 0.05 |
| B1 | 15.56 | 713.3 | 82.98 | 24.12 | 0.08 |

From the above experimental results, it can be seen that as compared with the solar cell B1, the open circuit voltage of the solar cell A2 increased by 1.1 mV, the fill factor of the solar cell A2 increased by about 0.02%, the conversion efficiency of the solar cell A2 increased by 0.06%, and the leakage current of the solar cell A2 under a 12V bias voltage decreased from 0.08 A to 0.05 A. It can be seen that the solar cell A2 prepared by the method in Example 2 has a lower leakage current and a higher efficiency.

With the rapid development and expanding application of photovoltaic technology, the market demand for high-efficiency photovoltaic modules is increasing. Conventional photovoltaic modules are typically encapsulated using a full-chip design. However, with the continuous increase of the output current, the impact of internal losses becomes more significant. To reduce the internal losses and improve the output power of the photovoltaic modules, the encapsulation technology has gradually evolved to the current half-cell or multi-cell technology. This technology often adopts a laser cutting method to divide a standard-sized solar cell into half or multiple cell segments. However, the laser cutting technology results in high carrier recombination at the cut edges of the resulting half-cells, creating a large number of dangling bonds and defect states at the surfaces, which become effective recombination centers for carriers. In addition, the cut edges of the half-cells are prone to have a leakage problem, ultimately reducing the efficiency of the solar cell.

In an embodiment of the present application, the cutting step is performed in the manufacture process of the solar cell, after the deposition of the passivating contact material. The cut-formed surface is further passivated by the first passivation layer and the second passivation layer that are subsequently deposited, which alleviates the carrier recombination at the cut-formed surface and increases the efficiency of the solar cell 100.

An embodiment of the present application provides another method for manufacturing a solar cell, which is adapted to manufacture the solar cell 100 in any of the above embodiments. The structures, functions, working principles, etc. relating to the solar cell 100 that have been described in the above embodiments may not be repeated herein. In this embodiment, the cutting step is performed during the step of forming the passivating contact layer 50.

Referring to FIGS. 28 to 33, the method for manufacturing the solar cell provided in the present embodiment includes S100 to S500.

S100, provide a wafer 101'. The wafer 101' includes a substrate 10 and a doped conducting material layer 30'. The substrate 10 includes a first surface F, a second surface S, and at least one first side surface C1. The first surface F and the second surface S are opposite to each other. The at least one first side surface C1 is adjacent to and between the first surface F and the second surface S. At least the first surface F and a portion of the first side surface C1 of the substrate 10 include a textured structure 20. The doped conducting material layer 30' is disposed at least on the first surface F and a portion of the first side surface C1 to cover the textured structure 20.

S200, form a passivating contact material layer 50' on each surface of the wafer 101'.

S300, cut the wafer 101' formed with the passivating contact material layer along the thickness direction H of the substrate to form a sub-wafer 102 including a cut edge side surface C2, so as to cut the doped conducting material layer 30' into a doped conducting layer 30. In some embodiments, the cutting step divides the wafer 101' into at least two sub-wafers 102.

S400, etch to remove the passivating contact material layer 50' on a surface F' of a first side of the sub-wafer 102 and side surfaces of the sub-wafer 102, so as to form the passivating contact layer 50 on the sub-wafer 102. The surface F' of the first side of the sub-wafer 20 corresponds to the first surface F of the substrate 10.

S500, form a first passivation layer 40 on the doped conducting layer 30. The first passivation layer 40 covers at least the first surface F and at least a portion of the first side surface C1, so as to at least cover the doped conducting layer 30. The first passivation layer 40 further covers at least a portion of the cut edge side surface C2. The cut edge side surface C2 is a side surface of the sub-wafer formed by cutting the wafer 101'.

In the above embodiment, the first surface F and a portion of the first side surface C1 of the substrate 10 include a textured structure 20. The doped conducting material layer 30' is at least disposed on the first surface F and at least a portion of the first side surface C1, so as to cover the textured structure 20. Since a portion of the first side surface C1 has the textured structure and the doped conducting material layer 30' is disposed on the textured structure 20, the doped conducting material layer 30' on the first side surface C1 in the cut solar cell 100 is conducive to reducing recombination of carriers at the interface at the first side surface C1, thereby achieving relatively good passivation effect on the first side surface C1. In addition, in the cut solar cell 100, the textured structure 20 in the first side surface C1 increases the light absorption area of the solar cell 100, increasing the photogenerated current of the solar cell 100, which is conducive to the efficiency of the solar cell 100.

On the other hand, the first passivation layer 40 is formed on the doped conducting layer 30. The first passivation layer 40 covers at least a portion of the cut edge side surface C2, so that at least a portion of the cut edge side surface C2 is protected by the first passivation layer 40, which not only increases the passivation effect on the cut edge side surface C2, but also alleviates the recombination of carriers generated at the cut edge side surface C2. In addition, the first passivation layer 40 is an insulating layer, which c effectively prevents leakage currents at the cut edge side surface C2, thereby increasing the output power and the conversion efficiency of the solar cell 100.

Further, the first passivation layer 40 at least covers the first surface F and at least a portion of the first side surface C1, so as to cover at least the doped conducting layer 30. Since the first passivation layer 40 covers the first surface F and at least a portion of the first side surface C1, at least a portion of the first side surface C1 is protected by the first passivation layer 40, which not only increases the passivation effect on the first side surface C1, but also alleviates the recombination of carriers at the first side surface C1. In addition, the first passivation layer 40 is an insulating layer, which effectively prevents leakage currents at the first side surface C1, thereby increasing the output power and the conversion efficiency of the solar cell 100.

Figure 30:
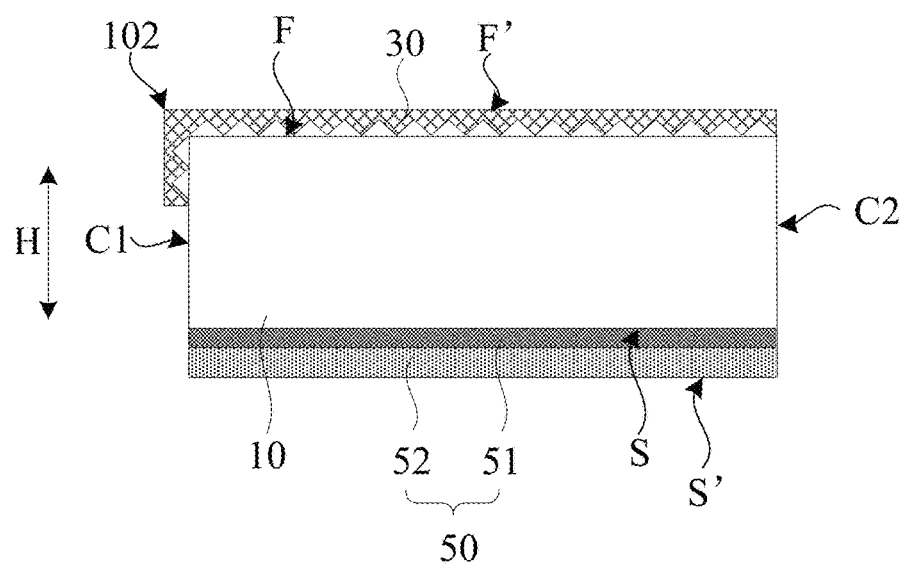
FIG. 30 is a structural schematic view of a sub-wafer in the method for manufacturing a solar cell according to an embodiment of the present application.

Referring to FIG. 30, in some embodiments, in the step S300, the wafer 101' is cut into at least two sub-wafers 102. That is, the solar cell 100 is achieved after the wafer 101' is cut in step S300. Thus, the size of the substrate 10 in the wafer 101' is larger than the size of the substrate 10 in the solar cell 100. Except the size and area, the first surface F and the second surface S of the substrate 10 in the wafer 101' is the same as those in the finally formed solar cell 100, which will not be repeatedly described herein.

The wafer 101' is cut into a plurality of sub-wafers 102, so that the size of some first side surfaces C1 of the substrate 10 of each sub-wafer 102 is reduced as compared with the original substrate 10, while a new surface formed by cutting (i.e., the cut edge side surface C2) is formed in the substrate 10 of the sub-wafer 102 (and of the solar cell 100).

Figure 29A:
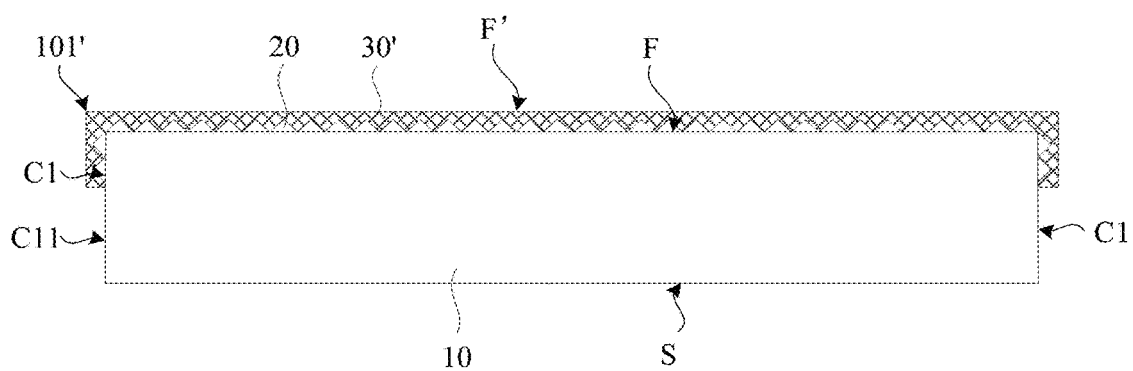
FIG. 29A is a structural schematic view of a wafer in a method for manufacturing a solar cell according to an embodiment of the present application.

Referring to FIG. 29A, in the wafer 101', a plurality of first side surfaces C1 of the substrate 10 can be connected to each other and jointly surrounds the first surface F. Each first side surface C1 is connected to the first surface F and the second side S. In addition, the first surface F and a portion of the first side surface C1 of the substrate 10 include the textured structure 20, which is similar to that in the above embodiments. For example, the textured structure 20 of the first surface F and the textured structure 20 of the first side surface C1 can form a continuous structure or a discontinuous structure. In this way, when a continuous structure is formed, the textured structure 20 as a whole forms a cover enveloping the first surface F of the substrate 10.

In the present embodiment, the doped conducting layer 30 is formed from the doped conducting material layer 30' after the cutting step in step S300. Thus, the material, structure, and coverage range of the doped conducting material layer 30' are the same as those of the doped conducting layer 30 in the above embodiments, which will not be repeatedly described herein.

The doped conducting material layer 30' is formed on the first surface F and a portion of each first side surface C1 to cover the textured structure 20. Therefore, a portion of the doped conducting material layer 30' is disposed on the first surface F, and another portion of the doped conducting material layer 30' is disposed on a portion of each first side surface C1. The coverage range of the doped conducting material layer 30' covers the textured structure 20. In some embodiments, the coverage range of the doped conducting material layer 30' may be larger than the coverage range of the textured structure 20. In some embodiments, the coverage range of the doped conducting material layer 30' is identical to the coverage range of the textured structure 20. That is, the doped conducting material layer 30' only and completely covers the textured structure 20.

Figure 29B:
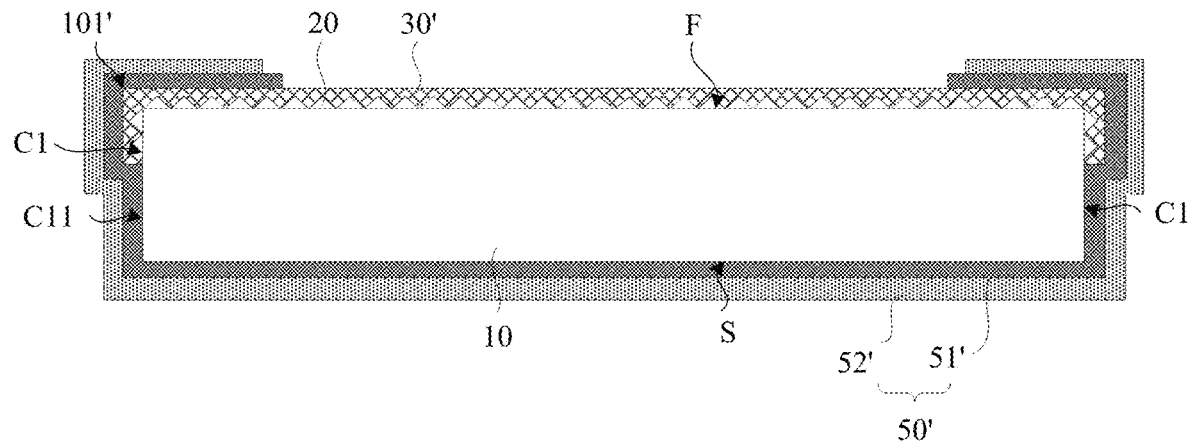
FIG. 29B is a structural schematic view of a wafer with a passivating contact material layer formed in a method for manufacturing a solar cell according to an embodiment of the present application.

Referring to FIG. 29B, in step S200, during forming the passivating contact material layer 50' on the second surface S of the substrate 10 of the wafer 101', the passivating contact material layer 50' will also be formed on the surface of the first side and each side surface of the wafer 101'. In step S400, except the passivating contact material layer 50' on the second surface S of the substrate 10 of the sub-wafer 102 formed by the cutting step, the passivating contact material layer 50' on all other surface is etched and thus removed, thereby forming the passivating contact layer 50. The material of the passivating contact material layer 50' is the same as that of the passivating contact layer 50 in the above embodiments. Exemplarily, the passivating contact material layer 50' can include a tunnel material layer 51' and a doped polysilicon material layer 52' stacked on the second surface S in sequence. The tunnel material layers 51' and 51 are the same in material and structure, and the doped polysilicon material layers 52' and 52 are the same in material and structure, which will not be repeatedly described herein.

Figure 31:
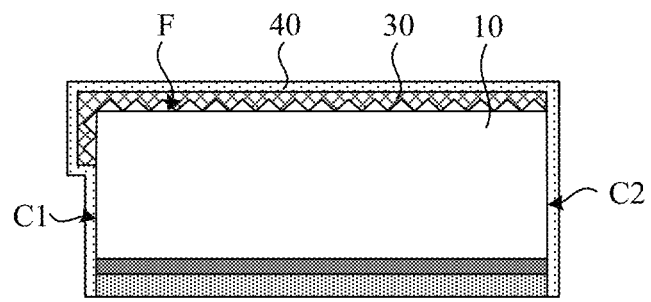
FIG. 31 is a schematic view of a first passivation layer formed in the method for manufacturing a solar cell according to an embodiment of the present application.

Referring to FIG. 31, in step S500, the first passivation layer 40 is formed on the doped conducting layer 30. The first passivation layer 40 has been described in detail in the above embodiments and will not be described repeatedly herein.

In some embodiments, in step S100, referring to FIG. 29A, the step of providing the wafer 101' includes:
  performing texturing treatment and diffusion of dopant elements to at least the first surface F and the first side surface C1 of the substrate 10; and
  etching the substrate 10 to expose the second surface S and a first target region C11 of each first side surface C1 of the substrate 10.

The first target region C11 is a region of each first side surface C1 of the substrate 10 adjacent to and connected to the second surface S.

In the above embodiment, in the texturing treatment, all surfaces of the substrate 10 can be textured and formed into textured surfaces. In the diffusion of dopant elements to the substrate 10, the first surface F of the substrate 10 can be doped with the dopant elements to form the doped conducting material layer 30', and some of the dopant elements wrap around the substrate 10 and deposit on the first side surface C1 and the second surface S of the substrate 10, so that the first side surface C1 and the second surface S are also covered with the doped conducting material. In the etching step, the first side surface C1 and the second surface S of the substrate 10 are etched by using a single-side etching technique, so as to remove the doped conducting material and the textured structure from the second surface S and the first target region C11 of the first side surface C1 of the substrate 10, thereby exposing the second surface S and the first target region C11 of each first side surface C1 of the substrate 10 to avoid leakage. As a result, the textured structure 20 and the doped conducting material layer 30' located on the first surface F and a portion of the first side surface C1 are remained and thus formed.

Specifically, the step of etching the substrate 10 to expose the second surface S and the first target region C11 of each first side surface C1 of the substrate 10 includes step D" and step E".

Step D": Etch the substrate 10 subjected to the texturing treatment and diffusion of dopant elements, so as to expose the textured structure in the second surface S and the first target region C11 of each first side surface C1. In some embodiments, the etching can be performed by using a continuous-type machine. During the etching process, the liquid level in the continuous-type machine needs to be controlled to avoid the etching solution being in contact with the textured structure 20 and the doped conducting material layer 30' on the first surface F of the substrate 10, so that after the etching step, the morphology on the first side surface C1 is irregular.

Step E": Etch to remove the exposed textured structure, so as to expose the second surface S and the first target region C11 of each first side surface C1 of the substrate 10. In some embodiments, the etching can be performed by using a through-type machine. It can be understood that etching to remove the textured structure 20 in the surface of the substrate 10 is to polish the textured structure 20 of the first target region C11 and the second surface S of the substrate 10, so as to form a non-textured structure, such as a relatively flat surface.

In some embodiments, in step S200, the step of forming the passivating contact material layer 50' on each surface of the wafer 101' includes a step of sequentially forming a tunnel material layer 51', a doped polysilicon material layer 52', and an oxide material layer (i.e., a mask layer) on each surface of the wafer 101'.

Referring to FIG. 30, in some embodiments, in step S400, the step of etching to remove the passivating contact material layer 50' on the surface of the first side and each side surface of the sub-wafer 102, so as to form the passivating contact layer 50 on the sub-wafer 102 includes:

etching to remove the oxide material layer on the surface F' of the first side of the sub-wafer 102 and on each side surface of the sub-wafer 102;

etching to remove the doped polysilicon material layer 52' and the tunnel material layer 51' on the surface F' of the first side of the sub-wafer 102 and on each side surface of the sub-wafer 102; and etching to polish the cut edge side surface C2 of the sub-wafer 102.

In this way, the cut edge side surface C2 formed by the cutting step can be etched and polished to remove the laser-damaged surface layer, thereby reducing the recombination of carriers at the interface of the cut edge side surface C2. Exemplarily, the step of etching to remove the oxide material layer is performed by using a through-type machine. The step of etching to remove the doped polysilicon material layer 52' and the tunnel material layer 51' is performed by using a trough-type machine.

Further, after the step of etching to remove the doped polysilicon material layer 52' and the tunnel material layer 51' on the surface F' of the first side of the sub-wafer 102 and on each side surface of the sub-wafer 102, the method further includes:

etching to remove the oxide material layer on a surface S' of a second side of the sub-wafer 102, thereby forming the passivating contact layer 50 on the sub-wafer 102, wherein the surface S' of the second side of the sub-wafer 102 corresponds to the second surface S of the substrate 10.

In some embodiments, in step S300, the step of cutting the wafer 101 formed with the passivating contact material layer 50' along the thickness direction H of the substrate to form at least two sub-wafers 102 includes:

laser cutting the wafer 101 formed with the passivating contact material layer 50' along the thickness direction H of the substrate 10 to form the sub-wafers 102.

In some embodiments, one wafer 101 can be divided into two equal sized sub-wafers 102 by one laser cutting step. It can be understood that, in the sub-wafer 102, the substrate 10, the textured structure 20, and the doped conducting layer 30 can be the same as that in the solar cell 100 in the above embodiments.

Figure 32:
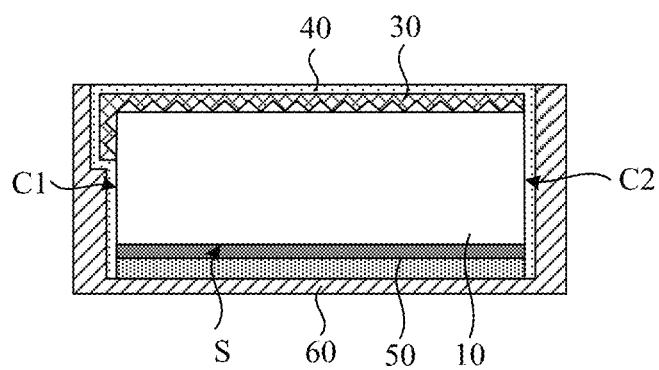
FIG. 32 is a schematic view of a second passivation layer formed in the method for manufacturing a solar cell provided in an embodiment of the present application.

In some embodiments, referring to FIG. 32, in step S500, after the step of forming the first passivation layer 40 on the doped conducting layer 30, the method further includes:

forming a second passivation layer 60 on the passivating contact layer 50, wherein the second passivation layer 60 covers at least the second surface S, at least a portion of each first side surface C1, and at least a portion of each cut edge side surface C2, so as to cover the passivating contact layer 50 and at least a portion of the first passivation layer 40.

In this way, the first passivation layer 40 and the second passivation layer 60 together protect at least a portion of the first side surface C1 and at least a portion of the cut edge side surface C2, which not only increases the passivation effect on the first side surface C1 and the cut edge side surface C2, but also alleviates the recombination of carriers at the side surface of the solar cell 100. In addition, the first passivation layer 40 and the second passivation layer 60 are insulating layers, which can effectively prevent leakage currents at the side surfaces of the solar cell 100, thereby increasing the output power and the conversion efficiency of the solar cell 100.

Figure 33:
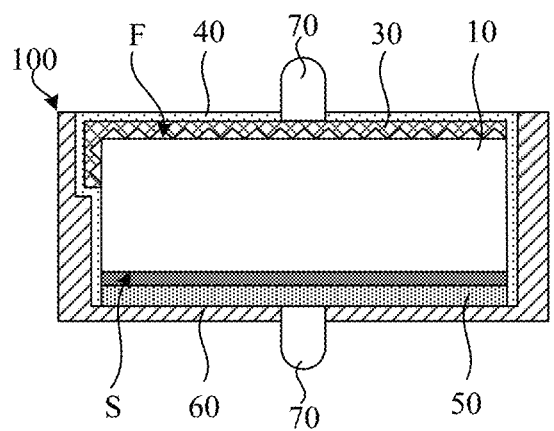
FIG. 33 is a schematic view of a solar cell formed in the method for manufacturing a solar cell according to an embodiment of the present application.

In some embodiments, referring to FIG. 33, after the step of forming the second passivation layer 60 on the passivating contact layer 50, the method further includes:

respectively forming electrodes 70 on the first passivation layer 40 and the second passivation layer 60, so as to form the solar cell 100.

As shown in FIG. 33, the electrode 70 disposed at the first surface F side of the substrate 10 penetrates the first passivation layer 40 and is connected to the doped conducting layer 30. The electrode 70 disposed at the second surface S side of the substrate 10 penetrates the second passivation layer 60 and is connected to the passivating contact layer 50.

A specific example is given below to illustrate the method for manufacturing the solar cell in the present embodiment.

Example 3: A Method for Manufacturing a Solar Cell Includes Steps SJ" to SO"

Step SJ": Referring to FIG. 29A, surfaces of a substrate 10 are textured and diffused with boron elements. The substrate 10 is then etched to expose the second surface S and the first target region C11 of each first side surface C1 of the substrate 10, so as to remain the textured structure 20 in the first surface F and a portion of the first side surface C1 of the substrate 10, and remain a doped conducting layer 30 (i.e., the boron-doped conducting layer) covering the textured structure 20 of the first surface F and a portion of the first side surface C1, thereby forming a wafer 101.

Step SK'': Referring to FIG. 29B, a tunnel material layer 51', a doped polysilicon material layer 52', and an oxide material layer are sequentially formed on surfaces of the wafer 101'.

Step SL'': Referring to FIG. 30, the wafer 101' formed with the passivating contact material layer is cut along the thickness direction H of the substrate, thereby forming at least two sub-wafers 102. As such, the doped conducting material layer 30' is cut into doped conducting layers 30. The oxide material layer on the surface F' of the first side of the sub-wafer 102 and on each side surface of the sub-wafer 102 are etched and thus removed. The doped polysilicon material layer 52' and the tunnel material layer 51' on the surface F' of the first side of the sub-wafer 102 and on each side surface of the sub-wafer 102 are etch and thus removed. The cut edge side surface C2 of the sub-wafer 102 formed by cutting is etched and polished. As such, only the tunnel material layer 51', the doped polysilicon material layer 52', and the oxide material layer on the second surface S of the substrate 10 of the sub-wafer 102 remain. The oxide material layer, for example, a silicon oxide layer, can function as a mask in a subsequent manufacture process, and can be removed by a subsequent process such as etching. In this way, the passivating contact layer 50 can be formed on the sub-wafer 102.

Step SM'': Referring to FIG. 31, the first passivation layer 40 is formed on the doped conducting layer 30. The first passivation layer 40 covers at least the surface F' of the first side of the sub-wafer 102 (corresponding to the first surface F of the substrate 10) and at least a portion of the first side surface C1, thereby covering at least the doped conducting layer 30. The first passivation layer 40 also covers at least a portion of the cut edge side surface C2.

Step SN'': Referring to FIG. 32, a second passivation layer 60 is formed on the passivating contact layer 50. The second passivation layer 60 covers at least the surface of the second side of the sub-wafer 102, at least a portion of the first side surface C1, and at least a portion of the cut edge side surface C2, thereby covering the passivating contact layer 50 and at least a portion of the first passivation layer 40. The surface of second side of the sub-wafer 102 corresponds to the second surface S of the substrate 10.

Step SO'': Referring to FIG. 33, electrodes 70 are respectively formed on the first passivation layer 40 and the second passivation layer 60.

The solar cell 100 manufactured through steps SJ'' to sSO'' will be referred to as solar cell A3.

The solar cell A3 and the solar cells B1 and B2 were subjected to performance tests. The test results were recorded in Table 3, wherein Uoc represents the open circuit voltage, FF represents the fill factor, Eta represents the conversion efficiency, Isc represents the short-circuit current, and IRev2 represents the reverse current.

TABLE 3

Test results of performance of solar cells

| Solar cell | Isc (A) | Uoc (mV) | FF (%) | Eta (%) | IRev2 (A) |
|---|---|---|---|---|---|
| A3 | 7.77 | 713.9 | 82.94 | 24.10 | 0.07 |
| B1 | 15.56 | 713.3 | 82.98 | 24.12 | 0.08 |
| B2 | 7.76 | 712.2 | 82.21 | 23.80 | 0.09 |

From the above experimental results, it can be seen that the efficiency of the solar cell A3 (being cut) prepared by the method in Example 3 is substantially the same as the efficiency of the intact solar cell B1 (uncut) in Comparative Example 1. However, as compared with the solar cell B2 that was cut in Comparative Example 2, the open circuit voltage of the solar cell A3 increased by 1.7 mV, the fill factor of the solar cell A3 increased by about 0.73%, the conversion efficiency of the solar cell A3 increased by about 0.3%, and the reverse current of the solar cell A3 decreased from 0.09 A to 0.07 A. It can be seen that the solar cell A3 prepared by the method in Example 3 has a higher efficiency.

Figure 34:
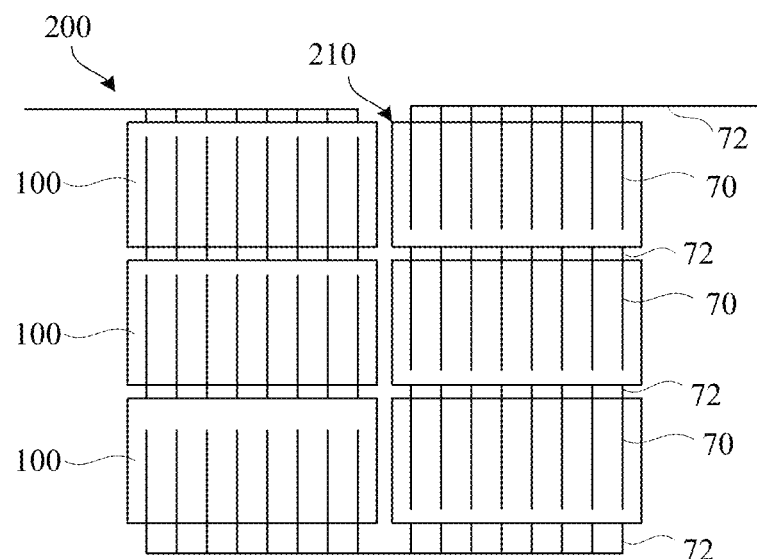
FIG. 34 is a structural schematic view of a photovoltaic module provided in an embodiment of the present application.

Referring to FIG. 34, an embodiment of the present application provides a photovoltaic module 200, which includes at least one cell group 210. The cell group 210 includes one or more solar cells 100 provided by any of the above embodiments. The solar cells 100 can be connected together by series welding.

Figure 35:
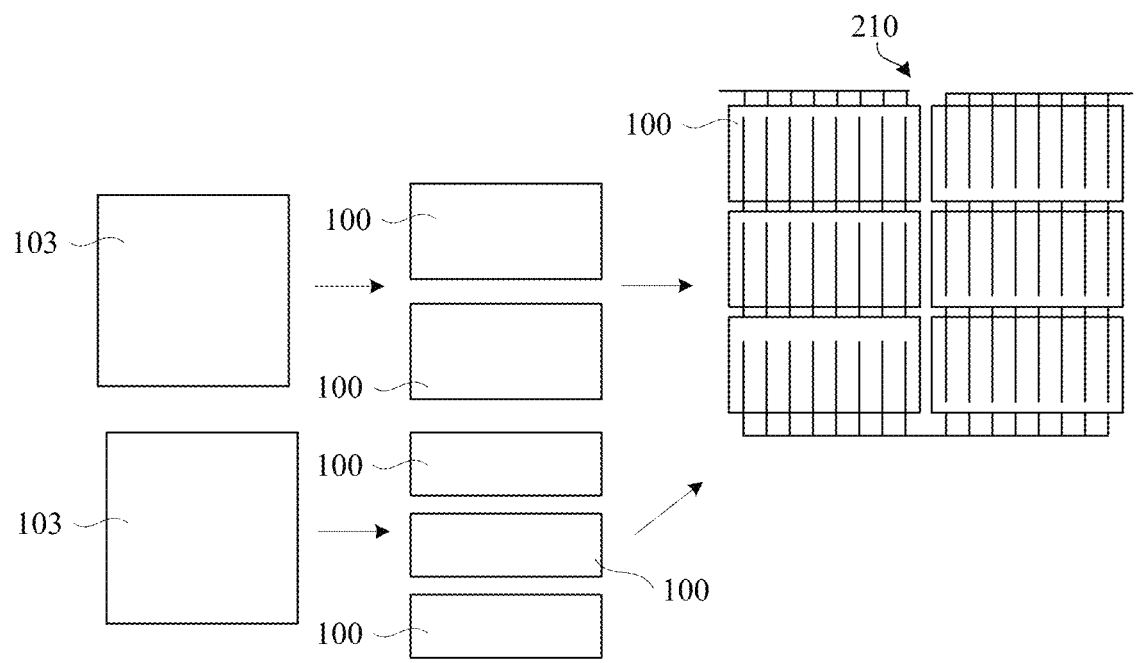
FIG. 35 is a schematic view showing a manufacture process of a photovoltaic module provided in an embodiment of the present application.

Further, referring to FIG. 35, the solar cell matrix 103 formed in step S40 can be cut into halves or three parts, to obtain a plurality of solar cells 100. The plurality of solar cells 100 are connected together by serial welding, thereby forming the photovoltaic module 200.

Exemplarily, the plurality of solar cells 100 can be connected in series through a welding strip, so as to collect the electric energy generated by separate solar cells 100 for subsequent transmission. Specifically, the electrodes 70 on the front side of each solar cell 100 is electrically connected to the electrodes 70 on the back side of an adjacent solar cell 100 by conductive strips, and the electrodes 70 on the back side of each solar cell 100 is electrically connected to the electrodes 70 on the front side of another adjacent solar cell 100 by conductive strips, so that the solar cells 100 are connected in series. The solar cells 100 can be arranged at intervals, or can be stacked together in an imbricated form.

Exemplarily, the photovoltaic module 200 further includes an encapsulation layer and a cover plate (not shown). The encapsulation layer is configured to cover the surface of the cell group 210. The cover plate is configured to cover the surface of the encapsulation layer away from the cell group 210. The solar cells 100 are electrically connected into a whole piece or multiple pieces, to form a plurality of cell groups 210. The plurality of cell groups 210 are electrically connected in series and/or in parallel. Specifically, in some embodiments, the plurality of cell group 210 can be electrically connected through conductive strips. The encapsulation layer covers the surface of the solar cells 100. Exemplarily, the encapsulation layer can be an organic encapsulation film, such as an ethylene-vinyl acetate copolymer film, a polyethylene-octene elastomer film, or a polyethylene terephthalate film. The cover plate can be with a light-transmitting function, such as a glass cover plate, a plastic cover plate, or the like.

An embodiment of the present application provides a photovoltaic system, including the photovoltaic module 200 in any of the above embodiments.

The photovoltaic system can be applied to photovoltaic power stations, such as ground power stations, roof power stations, water surface power stations, etc. Alternatively, the photovoltaic system can be applied to equipment or devices that use solar energy to generate electricity, such as user solar power supplies, solar street lights, solar cars, solar buildings, etc. It can be understood that the application scenarios of the photovoltaic system are not limited to the above, that is, the photovoltaic system can be applied in all fields that need to use solar energy to generate electricity. Taking a photovoltaic power generation network as an example, the photovoltaic system can include photovoltaic arrays, a combiner box, and an inverter. The photovoltaic array can be an array of multiple photovoltaic modules 200. For example, the multiple photovoltaic modules 200 can form multiple photovoltaic arrays. The photovoltaic arrays are connected to the combiner box, which can combine the currents generated by the photovoltaic arrays. The combined current flows through the inverter and is converted into the alternating current suitable for the power grid, and then connected to the power grid to realize solar power supply.

The technical features of the above embodiments can be combined arbitrarily. In order to make the description concise, not all possible combinations of the technical features are described in the embodiments. However, as long as there is no contradiction in the combination of these technical features, the combinations should be considered as in the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A solar cell, comprising:
   a substrate, including a first surface, a second surface, and at least one first side surface, the first surface and the second surface being opposite to each other, the at least one first side surface being adjacent to and between the first surface and the second surface, and at least the first surface and a portion of the at least one first side surface of the substrate including a textured structure;
   a doped conducting layer, disposed at least on the first surface and the portion of the at least one first side surface to cover the textured structure;
   a first passivation layer, stacked on the doped conducting layer and covering the first surface and at least the portion of the at least one first side surface, thereby covering at least the doped conducting layer;
   a passivating contact layer, disposed on the second surface; and
   a second passivation layer, stacked on the passivating contact layer and covering the second surface, thereby covering the passivating contact layer;
   wherein the portion of the at least one first side surface of the substrate including the textured structure is a textured region, the at least one first side surface further includes a flat region adjacent to the textured region, and the textured region is adjacent to the first surface; and
   wherein on the at least one first side surface, an edge of the first passivation layer is flush with an edge of the doped conducting layer, or the first passivation layer extends beyond an edge of the doped conducting layer along a thickness direction of the substrate.

2. The solar cell according to claim 1, wherein on the at least one first side surface, the first passivation layer completely covers the textured region and covers at least a portion of the flat region.

3. The solar cell according to claim 2, wherein the edge of the first passivation layer away from the first surface is flush with a surface of the passivating contact layer away from the substrate.

4. The solar cell according to claim 1, wherein the substrate further includes at least one cut edge side surface adjacent to and between the first surface and the second surface; and
   only the first surface and the portion of the at least one first side surface include the textured structure, and the doped conducting layer is only disposed on the first surface and the portion of the at least one first side surface to cover the textured structure.

5. The solar cell according to claim 4, wherein in the normal direction of the at least one cut edge side surface, the at least one cut edge side surface is flush with edges of the doped conducting layer, the first passivation layer, the passivating contact layer, and the second passivation layer located on the same side as the at least one cut edge side surface.

6. The solar cell according to claim 4, wherein the first passivation layer further at least partially covers the at least one cut edge side surface.

7. The solar cell according to claim 6, wherein the second passivation layer further at least partially covers the at least one cut edge side surface, thereby covering at least a portion of the first passivation layer located on the at least one cut edge side surface.

8. The solar cell according to claim 1, wherein the substrate further includes at least one cut edge side surface adjacent to and between the first surface and the second surface;
   at least a portion of the at least one cut edge side surface includes the textured structure, and the doped conducting layer is disposed on the first surface, the portion of the at least one first side surface, and the portion of the at least one cut edge side surface, thereby covering the textured structure; and
   the first passivation layer further covers at least the portion of the at least one cut edge side surface, thereby covering at least the doped conducting layer.

9. The solar cell according to claim 8, wherein the second passivation layer further at least partially covers the at least one cut edge side surface, thereby covering at least a portion of the first passivation layer located on the at least one cut edge side surface.

10. The solar cell according to claim 8, wherein on the at least one cut edge side surface, an edge of the first passivation layer away from the first surface is flush with another edge of the doped conducting layer.

11. The solar cell according to claim 1, wherein the second passivation layer further at least partially covers the at least one first side surface, thereby covering at least a portion of the first passivation layer on the at least one first side surface.

12. The solar cell according to claim 11, wherein the portion of the at least one first side surface of the substrate including the textured structure is a textured region, the at least one first side surface further includes a flat region adjacent to the textured region;
   the first passivation layer includes a first portion located on the at least one first side surface, and the first portion covers the flat region; and
   the second passivation layer covers at least the first portion.

13. The solar cell according to claim 12, wherein the first passivation layer further includes a second portion located on the at least one first side surface, and the second portion covers the textured region; and
   the second passivation layer covers the first portion and at least a portion of the second portion.

14. The solar cell according to claim 13, wherein an edge of the second passivation layer away from the second surface is flush with an outer surface of the first passivation layer on the first surface.

15. The solar cell according to claim 1, wherein the textured structure of the first surface and the textured structure of the at least one first side surface form a continuous structure.

16. The solar cell according to claim 1, wherein the first passivation layer includes a first passivation film and a first anti-reflection film stacked on the doped conducting layer; and/or
the second passivation layer includes at least one second anti-reflection film stacked on the passivating contact layer.

17. The solar cell according to claim 1, further includes a first electrode and a second electrode, wherein the first electrode penetrates the first passivation layer and is in contact with the doped conducting layer, the second electrode penetrates the second passivation layer and is in contact with the passivating contact layer, the first electrode and the second electrode are spaced from the substrate.

18. A solar cell, comprising:
a substrate, having a first surface, a second surface, and at least one first side surface, the first surface and the second surface being opposite to each other, the at least one first side surface being adjacent to and between the first surface and the second surface, and at least the first surface and a portion of the at least one first side surface of the substrate include a textured structure;
a doped conducting layer, disposed at least on the first surface and the portion of the at least one first side surface to cover the textured structure;
a first passivation layer, stacked on the doped conducting layer and covering the first surface and at least the portion of the at least one first side surface, thereby covering at least the doped conducting layer;
a passivating contact layer, disposed on the second surface; and
a second passivation layer, stacked on the passivating contact layer and covering the second surface, thereby covering the passivating contact layer;
wherein the doped conducting layer disposed on the at least one first side surface covers only part of the at least one first side surface.

19. The solar cell according to claim 18, wherein the portion of the at least one first side surface of the substrate that includes the textured structure is a textured region, the at least one first side surface includes a flat region adjacent to the textured region;
wherein on the at least one first side surface, the first passivation layer completely covers the textured region and covers at least a portion of the flat region;
wherein an edge of the first passivation layer away from the first surface is flush with a surface of the passivating contact layer away from the substrate.

20. A solar cell, comprising:
a substrate, including a first surface, a second surface, and at least one first side surface, the first surface and the second surface being opposite to each other, the at least one first side surface being adjacent to and between the first surface and the second surface, and at least the first surface and a portion of the at least one first side surface of the substrate including a textured structure;
a doped conducting layer, disposed at least on the first surface and the portion of the at least one first side surface to cover the textured structure;
a first passivation layer, stacked on the doped conducting layer and covering the first surface and at least the portion of the at least one first side surface, thereby covering at least the doped conducting layer;
a passivating contact layer, disposed on the second surface; and
a second passivation layer, stacked on the passivating contact layer and covering the second surface, thereby covering the passivating contact layer;
wherein the portion of the at least one first side surface of the substrate including the textured structure is a textured region, the at least one first side surface further includes a flat region adjacent to the textured region;
wherein on the at least one first side surface, the first passivation layer only covers the textured region; and
wherein on the at least one first side surface, an edge of the first passivation layer is flush with an edge of the doped conducting layer.

* * * * *